(12) United States Patent
Bower et al.

(10) Patent No.: US 11,540,398 B2
(45) Date of Patent: *Dec. 27, 2022

(54) METHODS OF MAKING PRINTED STRUCTURES

(71) Applicant: X Display Company Technology Limited, Dublin (IE)

(72) Inventors: Christopher Andrew Bower, Raleigh, NC (US); Matthew Alexander Meitl, Durham, NC (US); Brook Raymond, Cary, NC (US); Salvatore Bonafede, Chapel Hill, NC (US)

(73) Assignee: X Display Company Technology Limited, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 17/705,763

(22) Filed: Mar. 28, 2022

(65) Prior Publication Data

US 2022/0232707 A1 Jul. 21, 2022

Related U.S. Application Data

(63) Continuation of application No. 16/722,935, filed on Dec. 20, 2019, now Pat. No. 11,483,937.
(Continued)

(51) Int. Cl.
*H05K 3/32* (2006.01)
*H05K 1/11* (2006.01)
(Continued)

(52) U.S. Cl.
CPC ............... *H05K 3/321* (2013.01); *B32B 7/14* (2013.01); *B32B 37/10* (2013.01);
(Continued)

(58) Field of Classification Search
CPC .. C08J 2323/08; C08J 2423/04; C08J 2423/08; C08J 5/18; B23B 2250/02;
(Continued)

(56) References Cited

U.S. PATENT DOCUMENTS

| 6,142,358 A | 11/2000 | Cohn et al. |
| 6,969,624 B2 | 11/2005 | Iwafuchi et al. |

(Continued)

FOREIGN PATENT DOCUMENTS

JP    H11-142878 A    5/1999

OTHER PUBLICATIONS

Bower, C. A. et al., Emissive displays with transfer-printed assemblies of 8 μm x15 μm inorganic light-emitting diodes, Photonics Research, 5(2):A23-A29, (2017).
(Continued)

*Primary Examiner* — Sonya M Sengupta
(74) *Attorney, Agent, or Firm* — Choate, Hall & Stewart LLP; Michael D. Schmitt

(57) ABSTRACT

An example of a method of making a printed structure comprises providing a destination substrate, contact pads disposed on the destination substrate, and a layer of adhesive disposed on the destination substrate. A stamp with a component adhered to the stamp is provided. The component comprises a stamp side in contact with the stamp and a post side opposite the stamp side, a circuit, and connection posts extending from the post side. Each of the connection posts is electrically connected to the circuit. The component is pressed into contact with the adhesive layer to adhere the component to the destination substrate and to form a printed structure having a volume defined between the component and the destination substrate. The stamp is removed and the printed structure is processed to fill or reduce the volume.

20 Claims, 20 Drawing Sheets

Related U.S. Application Data

(60) Provisional application No. 62/786,286, filed on Dec. 28, 2018.

(51) Int. Cl.
*H05K 1/18* (2006.01)
*B32B 7/14* (2006.01)
*B32B 37/10* (2006.01)
*B32B 37/12* (2006.01)
*B32B 37/26* (2006.01)
*B32B 37/16* (2006.01)

(52) U.S. Cl.
CPC .......... *B32B 37/1292* (2013.01); *B32B 37/16* (2013.01); *B32B 37/26* (2013.01); *H05K 1/111* (2013.01); *H05K 1/181* (2013.01); *B32B 2307/202* (2013.01); *B32B 2309/02* (2013.01); *B32B 2457/14* (2013.01); *B32B 2457/206* (2013.01); *H05K 2201/10795* (2013.01); *H05K 2201/10803* (2013.01)

(58) Field of Classification Search
CPC ............ B23B 2250/03; B23B 2250/04; B23B 2250/05; B23B 2250/242; B23B 2262/101; B23B 2264/102; B23B 2270/00; B23B 2274/00; B23B 2307/202; B23B 2307/54; B23B 2307/558; B23B 2307/7145; B23B 2307/246; B23B 2307/7265; B23B 2307/732; B23B 2309/02; B23B 2419/00; B23B 2457/14; B23B 2457/206; B23B 27/08; B23B 27/20; B23B 27/205; B23B 27/22; B23B 27/32; B23B 27/327; B23B 37/10; B23B 37/1292; B23B 37/16; B23B 7/14; H01L 21/4853; H01L 21/6835; H01L 2221/68345; H01L 2221/68363; H01L 2221/68381; H01L 2224/0401; H01L 2224/04105; H01L 2224/05624; H01L 2224/05638; H01L 2224/13007; H01L 2224/13017; H01L 2224/1302; H01L 2224/131; H01L 2224/13186; H01L 2224/1319; H01L 2224/13562; H01L 2224/136; H01L 2224/1403; H01L 2224/1411; H01L 2224/16227; H01L 2224/16237; H01L 2224/24105; H01L 2224/24226; H01L 2224/25171; H01L 2224/75745; H01L 2224/7598; H01L 2224/81; H01L 2224/81097; H01L 2224/81191; H01L 2224/81201; H01L 2224/81395; H01L 2224/81411; H01L 2224/81815; H01L 2224/81986; H01L 2224/82; H01L 2224/8203; H01L 2224/82101; H01L 2224/95; H01L 2224/95136; H01L 23/49811; H01L 24/25; H01L 24/81; H01L 24/82; H01L 24/95; H01L 2924/00014; H01L 2924/01014; H01L 2924/1031; H01L 2924/014; H01L 2924/0503; H01L 2924/0665; H01L 2933/0066; H01L 33/62; Y02P 70/50; Y02E 10/549; C08L 2205/025; C08L 2207/066; C08L 23/0815; C08L 23/12
See application file for complete search history.

(56) References Cited

U.S. PATENT DOCUMENTS

| | | |
|---|---|---|
| 7,127,810 B2 | 10/2006 | Kasuga et al. |
| 7,195,733 B2 | 3/2007 | Rogers et al. |
| 7,354,801 B2 | 4/2008 | Sugiyama et al. |
| 7,521,292 B2 * | 4/2009 | Rogers ................ H01L 31/1804 438/455 |
| 7,557,367 B2 | 7/2009 | Rogers et al. |
| 7,605,053 B2 | 10/2009 | Couillard et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 8,333,860 B1 | 12/2012 | Bibl et al. |
| 8,470,701 B2 | 6/2013 | Rogers et al. |
| 8,558,243 B2 | 10/2013 | Bibl et al. |
| 8,722,458 B2 | 5/2014 | Rogers et al. |
| 8,791,474 B1 | 7/2014 | Bibl et al. |
| 8,794,501 B2 | 8/2014 | Bibl et al. |
| 8,835,940 B2 | 9/2014 | Hu et al. |
| 8,865,489 B2 | 10/2014 | Rogers et al. |
| 8,877,648 B2 | 11/2014 | Bower et al. |
| 8,889,485 B2 * | 11/2014 | Bower ................ H01L 21/6838 257/737 |
| 8,934,259 B2 | 1/2015 | Bower et al. |
| 8,941,215 B2 | 1/2015 | Hu et al. |
| 8,987,765 B2 | 3/2015 | Bibl et al. |
| 9,049,797 B2 * | 6/2015 | Menard ............... H01L 27/1266 |
| 9,087,764 B2 | 7/2015 | Chan et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 * | 10/2015 | Menard ................. H05K 13/04 |
| 9,165,989 B2 | 10/2015 | Bower et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,355,854 B2 | 5/2016 | Meitl et al. |
| 9,358,775 B2 | 6/2016 | Bower et al. |
| 9,367,094 B2 | 6/2016 | Bibl et al. |
| 9,412,727 B2 | 8/2016 | Menard et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,589,944 B2 | 3/2017 | Higginson et al. |
| 9,601,356 B2 * | 3/2017 | Bower ................. B81C 99/008 |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,865,832 B2 | 1/2018 | Bibl et al. |
| 9,929,053 B2 | 3/2018 | Bower et al. |
| 2003/0141570 A1 | 7/2003 | Chen et al. |
| 2010/0123134 A1 | 5/2010 | Nagata |
| 2010/0289115 A1 | 11/2010 | Akiyama et al. |
| 2010/0306993 A1 | 12/2010 | Mayyas et al. |
| 2012/0126229 A1 * | 5/2012 | Bower ................. H01L 23/5389 257/E23.179 |
| 2013/0309792 A1 | 11/2013 | Tischler et al. |
| 2013/0316487 A1 | 11/2013 | de Graff et al. |
| 2014/0159043 A1 | 6/2014 | Sakariya et al. |
| 2016/0093600 A1 | 3/2016 | Bower et al. |

(56) References Cited

U.S. PATENT DOCUMENTS

| | | | |
|---|---|---|---|
| 2017/0048976 A1* | 2/2017 | Prevatte | H01L 24/08 |
| 2017/0338374 A1* | 11/2017 | Zou | H01L 25/0753 |
| 2020/0214141 A1 | 7/2020 | Bower et al. | |

OTHER PUBLICATIONS

Bower, C. A. et al., Micro-Transfer-Printing: Heterogeneous Integration of Microscale Semiconductor Devises using Elastomer Stamps, IEEE Conference, (2014).

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., Inorganic light-emitting diode displays using micro-transfer printing, Journal of the SID, 25(10):589-609, (2017).

Cok, R. S. et al., AMOLED displays with transfer-printed integrated circuits, Journal of SID, 19(4):335-341,(2011).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

Hamer et al., AMOLED Displays using Transfer-Printed Integrated Circuits, Society for Information Display International Symposium, 40(2):947 (2009).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

* cited by examiner

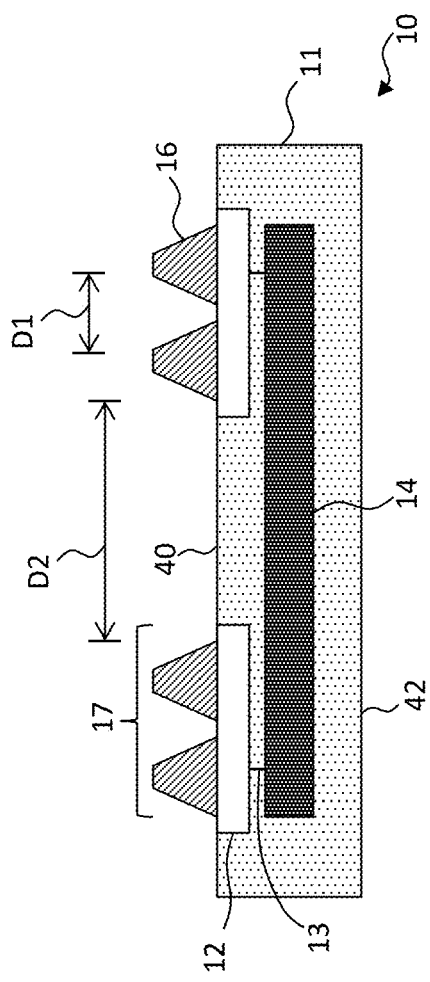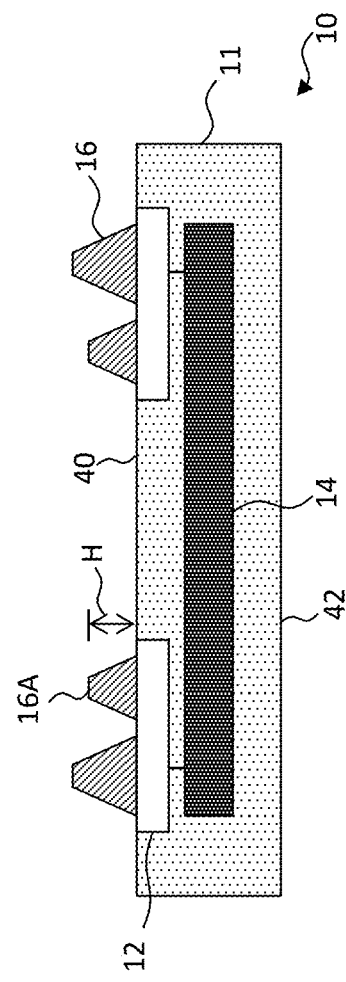

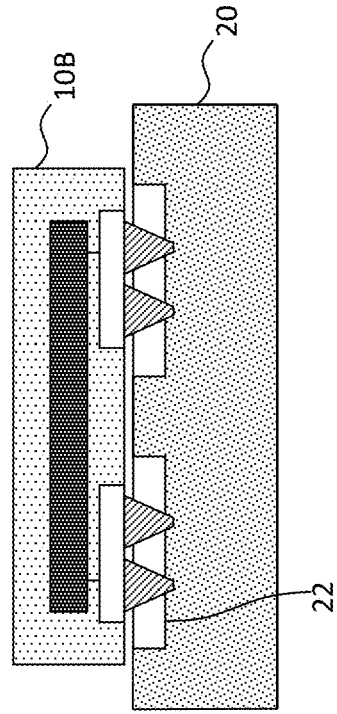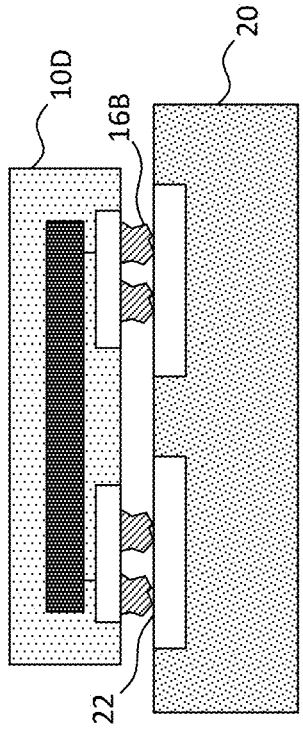
FIG. 7A  FIG. 7B
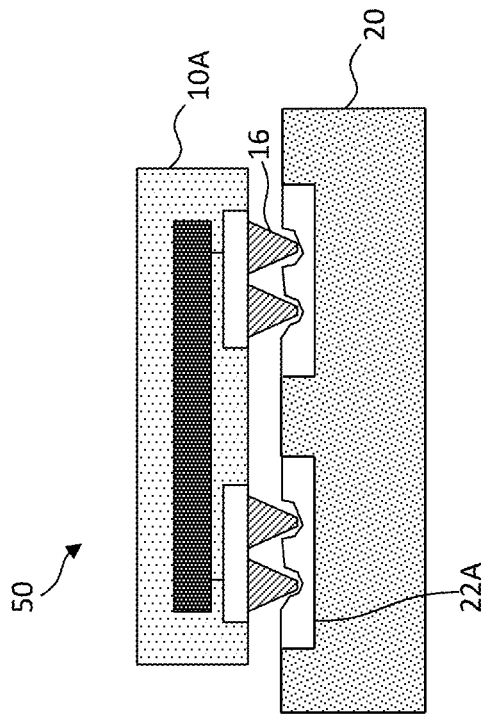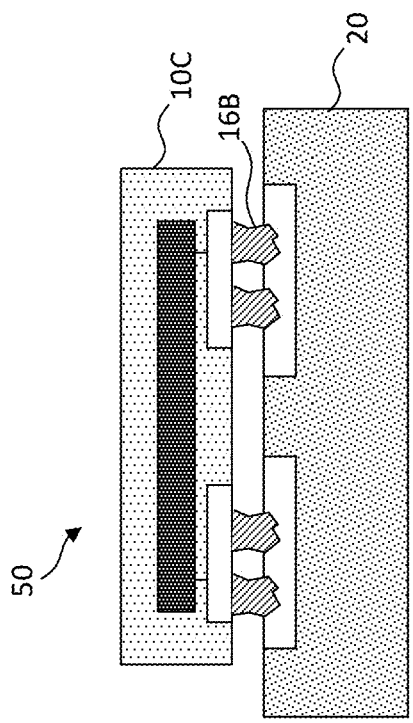
FIG. 8A  FIG. 8B

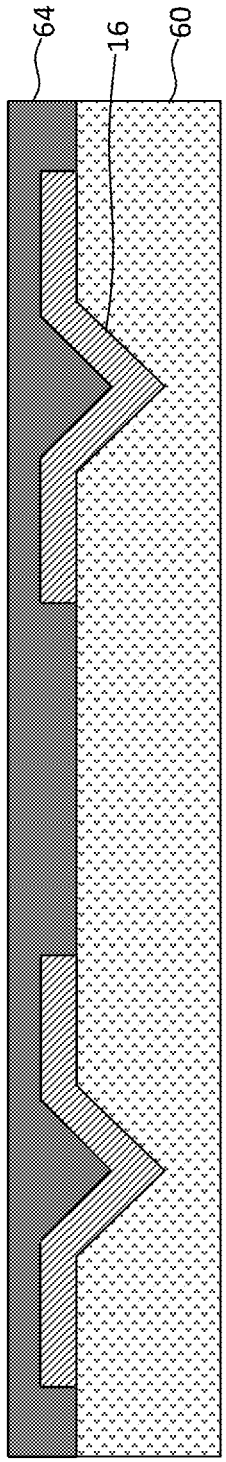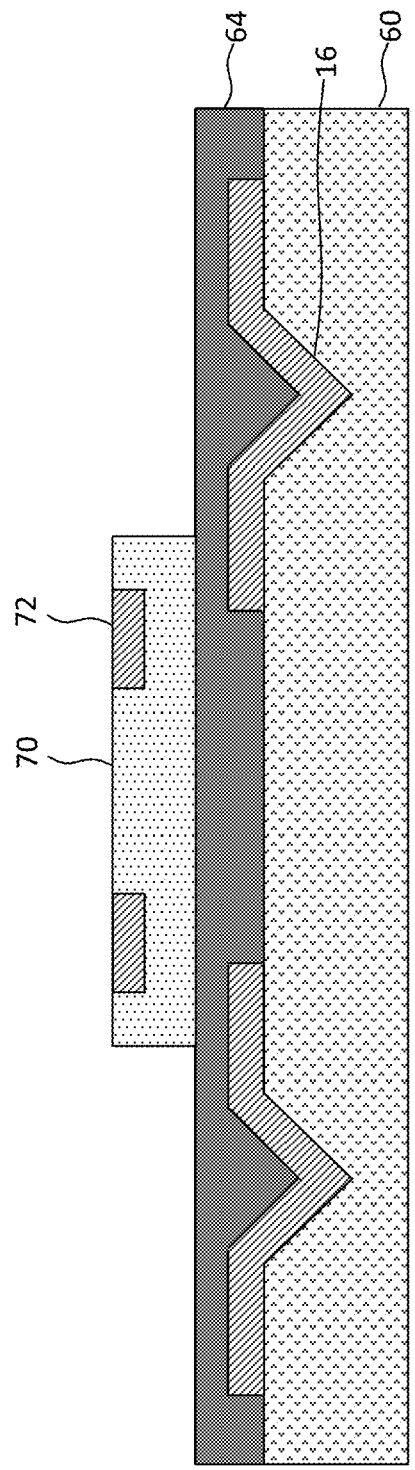

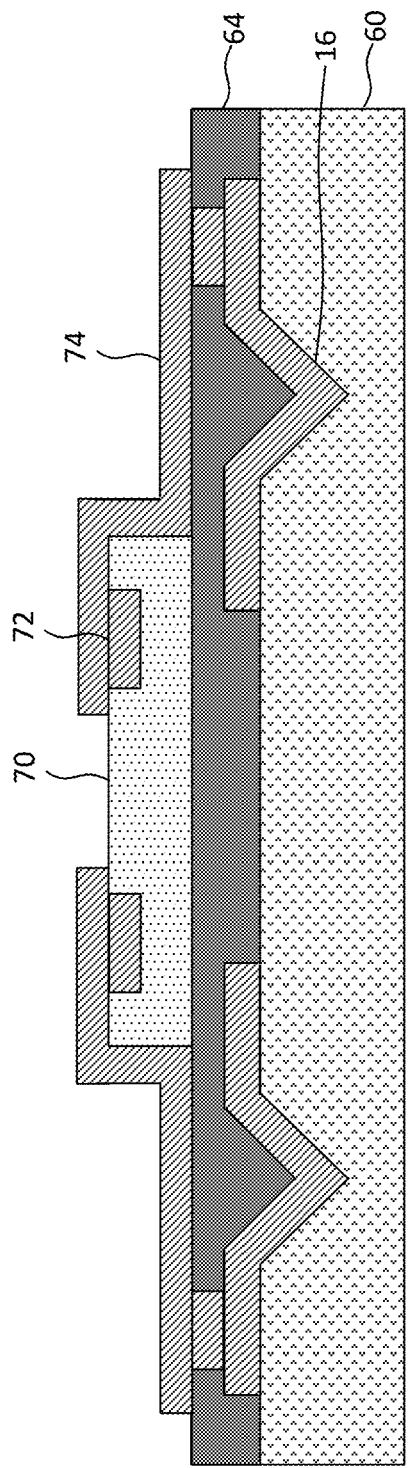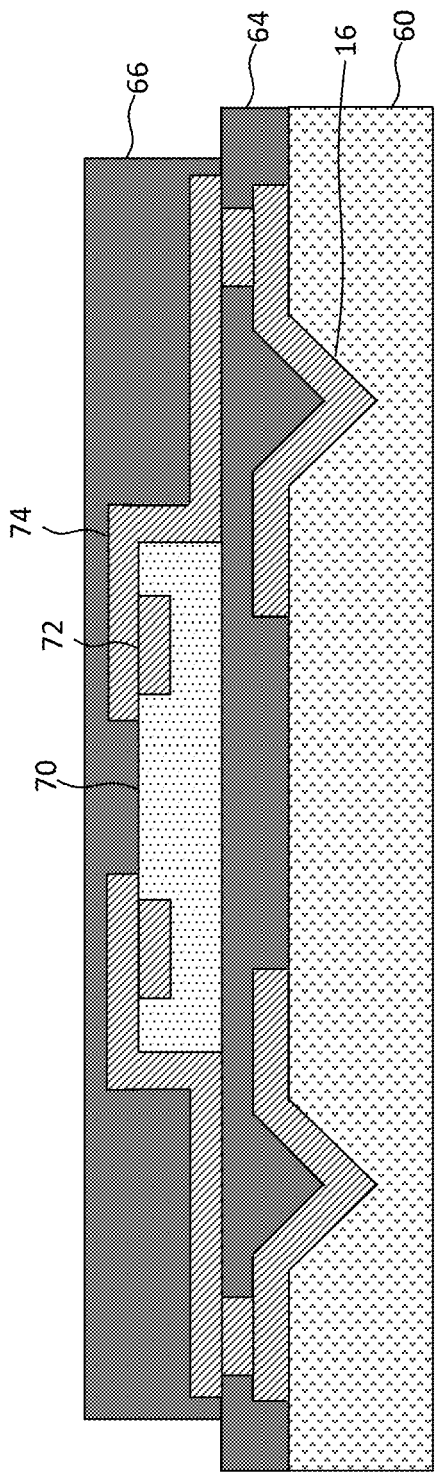

METHODS OF MAKING PRINTED STRUCTURES

PRIORITY APPLICATION

This application is a continuation of U.S. patent application Ser. No. 16/722,935, filed on Dec. 20, 2019, which claims the benefit of U.S. Provisional Patent Application No. 62/786,286, filed Dec. 28, 2018, entitled Methods of Making Printed Structures, the disclosure of each of which is hereby incorporated by reference herein in its entirety.

CROSS REFERENCE TO RELATED APPLICATIONS

Reference is made to U.S. patent application Ser. No. 14/822,864, filed on Aug. 10, 2015, entitled Chiplets with Connection Posts, and U.S. Pat. No. 8,889,485, issued Nov. 18, 2014, entitled *Methods for Surface Attachment of Flipped Active Components* by Christopher Bower, the disclosure of each of which is incorporated herein by reference in its entirety.

TECHNICAL FIELD

The present disclosure relates generally to structures and methods for electrically interconnecting components to contact pads on or in a destination substrate, for example using micro transfer printing.

BACKGROUND

Substrates with electronically active components distributed over the extent of the substrate may be used in a variety of electronic systems, for example, flat-panel imaging devices such as flat-panel liquid crystal or organic light emitting diode (OLED) display devices and in flat-panel solar cells. A variety of methods may be used to distribute electronically active circuits over substrates, including forming the electronically active circuits on a substrate and forming the components on separate substrates and placing them on a substrate. In the latter case, a variety of assembly technologies for device packaging may be used.

The electronically active components are typically formed on a substrate by sputtering a layer of inorganic semiconductor material or by spin-coating organic material over the entire substrate. Inorganic semiconductor materials can be processed to improve their electronic characteristics, for example amorphous silicon can be treated to form low-temperature or high-temperature poly-crystalline silicon. In other process methods, microcrystalline semiconductor layers can be formed by using an underlying seeding layer. These methods typically improve the electron mobility of the semiconductor layer. The substrate and layer of semiconductor material can be photo-lithographically processed to define electronically active components, such as transistors. Such transistors are known as thin-film transistors (TFTs) since they are formed in a thin layer of semiconductor material, typically silicon. Transistors may also be formed in thin layers of organic materials. In these devices, the substrate is often made of glass, for example Corning Eagle or Jade glass designed for display applications.

The above techniques have some limitations. Despite processing methods used to improve the performance of thin-film transistors, such transistors may provide performance that is lower than the performance of other integrated circuits formed in mono-crystalline semiconductor material. Semiconductor material and active components can be provided only on portions of the substrate, leading to wasted material and processing costs. The choice of substrate materials can also be limited by the processing steps necessary to process the semiconductor material and the photo-lithographic steps used to pattern the active components. For example, plastic substrates have a limited chemical and heat tolerance and do not readily survive photo-lithographic processing. Furthermore, the manufacturing equipment used to process large substrates with thin-film circuitry is relatively expensive. Other substrate materials that may be used include quartz, for example, for integrated circuits using silicon-on-insulator structures as described in U.S. Patent Publication No. 2010/0289115 and U.S. Patent Publication No. 2010/0123134. However, such substrate materials can be more expensive or difficult to process.

Other methods used for distributing electronically functional components over a substrate in the circuit board assembly industry include, for example, pick-and-place technologies for integrated circuits provided in a variety of packages, for example, pin-grid arrays, ball-grid arrays, and flip-chips. However, these techniques may be limited in the size of the integrated circuits that can be placed.

In further manufacturing techniques, a mono-crystalline semiconductor wafer is employed as the substrate. While this approach can provide substrates with the same performance as integrated circuits, the size of such substrates may be limited, for example, to a 12-inch diameter circle, and the wafers are relatively expensive compared to other substrate materials such as glass, polymer, or quartz.

In yet another approach, thin layers of semiconductor are bonded to a substrate and then processed. Such a method is known as semiconductor-on-glass or silicon-on-glass (SOG) and is described, for example, in U.S. Pat. No. 7,605,053, issued Oct. 20, 2009. If the semiconductor material is crystalline, high-performance thin-film circuits can be obtained. However, the bonding technique and the processing equipment for the substrates to form the thin-film active components on large substrates can be relatively expensive.

Publication No. 11-142878 of the Patent Abstracts of Japan entitled *Formation of Display Transistor Array Panel* describes etching a substrate to remove it from a thin-film transistor array on which the TFT array was formed. TFT circuits formed on a first substrate can be transferred to a second substrate by adhering the first substrate and the TFTs to the surface of the second substrate and then etching away the first substrate, leaving the TFTs bonded to the second substrate. This method may require etching a significant quantity of material, and may risk damaging the exposed TFT array.

Other methods of locating material on a substrate are described in U.S. Pat. No. 7,127,810. In this approach, a first substrate carries a thin-film object to be transferred to a second substrate. An adhesive is applied to the object to be transferred or to the second substrate in the desired location of the object. The substrates are aligned and brought into contact. A laser beam irradiates the object to abrade the transferring thin film so that the transferring thin film adheres to the second substrate. The first and second substrates are separated, peeling the film in the abraded areas from the first substrate and transferring it to the second substrate. In one embodiment, a plurality of objects is selectively transferred by employing a plurality of laser beams to abrade selected area. Objects to be transferred can include thin-film circuits.

U.S. Pat. No. 6,969,624 describes a method of transferring a device from a first substrate onto a holding substrate by selectively irradiating an interface with an energy beam. The interface is located between a device for transfer and the first substrate and includes a material that generates ablation upon irradiation, thereby releasing the device from the substrate. For example, a light-emitting device (LED) is made of a nitride semiconductor on a sapphire substrate. The energy beam is directed to the interface between the sapphire substrate and the nitride semiconductor releasing the LED and allowing the LED to adhere to a holding substrate coated with an adhesive. The adhesive is then cured. These methods, however, may require the patterned deposition of adhesive on the object(s) or on the second substrate. Moreover, the laser beam that irradiates the object may need to be shaped to match the shape of the object, and the laser abrasion can damage the object to be transferred. Furthermore, the adhesive cure takes time, which may reduce the throughput of the manufacturing system.

Another method for transferring active components from one substrate to another is described in "AMOLED Displays using Transfer-Printed Integrated Circuits" published in the Proceedings of the 2009 Society for Information Display International Symposium Jun. 2-5, 2009, in San Antonio Tex., US, vol. 40, Book 2, ISSN 0009-0966X, paper 63.2 p. 947. In this example approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured. U.S. Pat. No. 8,722,458, issued May 13, 2014, entitled *Optical Systems Fabricated by Printing-Based Assembly*, also teaches examples of transferring light-emitting, light-sensing, or light-collecting semiconductor elements from a wafer substrate to a destination substrate or backplane.

In some such methods it is generally necessary to electrically connect the small integrated circuits or chiplets to electrically conductive elements such as backplane contact pads on the destination substrate. By applying electrical signals to conductors on the destination substrate the small integrated circuits are energized and made operational. The electrical connections between the small integrated circuits and the backplane contact pads are typically made by photolithographic processes in which a metal is evaporated or sputtered onto the small integrated circuits and the destination substrate to form a metal layer, the metal layer is coated with a photoresist that is exposed to a circuit connection pattern, and the metal layer and photoresist are developed by etching and washing to form the patterned electrical connections between the small integrated circuits and the connection pads on the destination substrate. Additional layers, such as interlayer dielectric insulators can also be required. This process is expensive and requires a number of manufacturing steps. Moreover, the topographical structure of the small integrated circuits over the destination substrate can render the electrical connections problematic in certain implementations. For example it can be difficult to form a continuous conductor from the destination substrate to the small integrated circuit because of the differences in height over the surface between the small integrated circuits and the destination substrate.

There is a need, therefore, for structures and methods that enable the electrical interconnection of small integrated circuits, such as micro transfer printed chiplets, to destination substrates.

SUMMARY

In accordance with some embodiments, components such as chiplets incorporating active elements such as transistors and passive elements such as resistors, capacitors, and conductors are micro transfer printed from a native source wafer to a non-native destination substrate or backplane. The components include an electrically conducting connection post that protrudes from a component surface and is brought into contact with a backplane contact pad to form an electrical connection between the component and the destination substrate. The components can be at least partially adhered to the destination substrate by forcefully driving the connection posts into the backplane contact pads when micro transfer printing, for example by exerting mechanical pressure on the transfer stamp. The connection posts, the backplane contact pads, or both the connection posts and backplane contact pads can be deformed or crumpled and the connection post can be driven into or through the backplane contact pad, thereby wedging the connection post in the backplane contact pad to adhere the connection post to the backplane contact pad and form an electrical contact between them. As a consequence, the connection post can be welded to the backplane contact pad. An additional heat treatment can be provided to facilitate the welding. Alternatively or additionally, a layer of metal, for example a solder can be provided on either the surface of the connection post or the backplane contact pad, or both, that can be heated, causing the solder to reflow and thereby both adhere and electrically connect the connection post to the backplane contact pad. In a further embodiment, a defective chiplet is removed from the backplane contact pad, extracting the connection post from the backplane contact pad. The defective chiplet can be replaced, for example by micro transfer printing a different chiplet to the backplane contact pads in the former location of the defective chiplet.

In some embodiments, two or more connection posts are provided to contact a common backplane contact pad. By providing two or more connection posts in contact with a common backplane contact pad, faults in electrical connections between the component and the backplane contact pad are reduced by providing a redundant electrical connection from the component to the backplane contact pad.

Because the components can be made using integrated circuit photolithographic techniques having a relatively high resolution and cost and the destination substrate, for example a printed circuit board, can be made using printed circuit board techniques having a relatively low resolution and cost, the backplane contact pads on the destination substrate can be much larger than the connection posts or electrical contacts on the component, facilitating the use of multiple connection posts with a common backplane contact pads, reducing electrical faults, and reducing manufacturing costs.

In some aspects, the present disclosure is directed to a printable component, including: a chiplet having a semiconductor substrate; and a plurality of electrical connections, wherein each electrical connection comprises an electrically conductive connection post protruding from the semiconductor substrate, wherein the connection post is a multilayer connection post.

In certain embodiments, the connection post comprises a bulk material coated with a conductive material different from the bulk material.

In certain embodiments, the bulk material is electrically conductive.

In certain embodiments, the conductive material has a melting point less than the melting point of the bulk material.

In certain embodiments, the bulk material is an electrical insulator.

In certain embodiments, the bulk material is a resin, a polymer, or a cured resin.

In certain embodiments, the bulk material is softer than the conductive material.

In certain embodiments, the conductive material is softer than the bulk material.

In certain embodiments, the printable component is an active component having an active element, a passive component having a passive element, or a compound structure having a plurality of active elements, passive elements, or a combination of active and passive elements.

In certain embodiments, the printable component has at least one of a width, length, and height from 2 to 5 µm, 5 to 10 µm, 10 to 20 µm, or 20 to 50 µm.

In certain embodiments, the printable component is a light-emitting diode, photo-diode, or transistor.

In some aspects, the present disclosure is directed to a printable component, including: a chiplet having a semiconductor substrate; and a plurality of electrical connections protruding from the semiconductor substrate, wherein each electrical connection comprises an electrically conductive connection post protruding from the process side, wherein two or more adjacent connection posts are directly electrically connected to each other.

In certain embodiments, the two or more adjacent connection posts comprise a first and a second connection post of different heights.

In certain embodiments, the connection posts are disposed in groups and a spacing between adjacent connection posts within a given group is less than a spacing between adjacent groups.

In certain embodiments, the connection posts within a group are electrically shorted together.

In certain embodiments, the printable component is an active printable component having an active element, a passive printable component having a passive element, or a compound printable component having a plurality of active elements, passive elements, or a combination of active and passive elements.

In certain embodiments, each of the two or more connection posts is multi-layer connection post.

In certain embodiments, the printable component has at least one of a width, length, and height from 2 to 5 µm, 5 to 10 µm, 10 to 20 µm, or 20 to 50 µm.

In certain embodiments, the printable component is a light-emitting diode, photo-diode, or transistor.

In some aspects, the present disclosure is directed to a printed structure comprising a destination substrate and one or more printable components, wherein the destination substrate has two or more electrical contacts and each connection post is in contact with, extends into, or extends through an electrical contact of the destination substrate to electrically connect the electrical contacts to the connection posts.

In certain embodiments, the electrical contact comprises a material that is the same material as a material included in the connection post.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In some aspects, the present disclosure is directed to a printed structure comprising a destination substrate and one or more printable components, each of the printable components including: a chiplet having a semiconductor substrate; a plurality of electrical connections, wherein each electrical connection comprises an electrically conductive connection post protruding from the semiconductor substrate or a layer in contact with the semiconductor substrate, wherein the destination substrate comprises two or more backplane contact pads, wherein each connection post is in contact with, extends into, or extends through a backplane contact pad of the destination substrate to electrically connect the backplane contact pads to the connection posts, and wherein one or more of the backplane contact pads, one or more of the connection posts, or both one or more of the backplane contact pads and one or more of the connection posts is deformed or crumpled, or has a non-planar surface.

In certain embodiments, the two or more backplane contact pads comprise a material that is softer than that of the connection post.

In certain embodiments, the connection posts comprise a material that is softer than that of the two or more backplane contact pads.

In certain embodiments, a conductive material other than a material of the backplane contact pad or the connection post adheres or electrically connects (e.g., or both) the backplane contact pad to the conductive post.

In certain embodiments, the backplane contact pad has a first conductive layer and a second conductive layer over the first conductive layer, and the second conductive layer has a lower melting temperature than the first conductive layer, wherein the backplane contact pad is coated with a non-conductive layer, or wherein the backplane contact pad is formed on a compliant non-conductive layer.

In certain embodiments, the second conductive layer is a solder.

In certain embodiments, the electrical contact is welded to the connection post.

In certain embodiments, the backplane contact pads are non-planar and the connection posts are inserted into the backplane contact pads.

In certain embodiments, the printable component has at least one of a width, length, and height from 2 to 5 µm, 5 to 10 µm, 10 to 20 µm, or 20 to 50 µm.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, each of the one or more printable components is a light-emitting diode, photo-diode, or transistor.

In some aspects, the present disclosure is directed to a printed structure comprising a destination substrate and one or more printable components, the printable components including: a chiplet having a semiconductor substrate and a plurality of electrical connections, wherein: each electrical connection comprises an electrically conductive connection post protruding from the semiconductor substrate, the destination substrate has two or more backplane contact pads, each connection post is in contact with, extends into, or extends through a backplane contact pad of the destination substrate to electrically connect the backplane contact pads to the connection posts, and two or more connection posts are electrically connected to one backplane contact pad.

In certain embodiments, the distance between two or more connection posts is less than a width or length of the electrical contact in a direction parallel to the destination substrate.

In certain embodiments, the connection posts are disposed in groups, the connection posts within a group are electrically connected to a common backplane contact pad and the connection posts in different groups are electrically connected to different backplane contact pads.

In certain embodiments, the printable component has at least one of a width, length, and height from 2 to 5 µm, 5 to 10 µm, 10 to 20 µm, or 20 to 50 µm.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In some aspects, the present disclosure is directed to a method of making a printable component, including: providing a forming substrate having two or more forms in a surface of the substrate; disposing a patterned layer of conductive material at least in the forms to make connection posts; disposing a first dielectric layer over the patterned layer of conductive material and the forming substrate; disposing a chiplet having chiplet contact pads on the first dielectric layer; forming conductors electrically connecting the connection posts to the chiplet contact pads; and defining the printable component to form a release layer and anchors in the forming substrate connected by tethers to the printable component.

In certain embodiments, the method includes providing a destination substrate having two or more backplane contact pads; and micro transfer printing the printable component to the destination substrate so that each connection post is in contact with, extends into, or extends through a backplane contact pad of the destination substrate to electrically connect the backplane contact pads to the connection posts and the chiplet contact pads.

In certain embodiments, the method includes disposing a patterned second dielectric layer over the first dielectric layer, the conductors, and the chiplet.

In certain embodiments, the printable component has at least one of a width, length, and height from 2 to 5 µm, 5 to 10 µm, 10 to 20 µm, or 20 to 50 µm.

In certain embodiments, the printable component is a light-emitting diode, photo-diode, or transistor.

In some aspects, the present disclosure is directed to a printable component, including: a first dielectric layer having connection posts protruding from the dielectric layer; a chiplet having a semiconductor substrate and chiplet contact pads, the chiplet disposed on the first dielectric layer; and conductors electrically connecting the connection posts to the chiplet contact pads.

In certain embodiments, the chiplet contact pads are located on a same side of the chiplet adjacent to the connection posts.

In certain embodiments, the printable component includes a patterned electrical connection layer between the connection posts and the chiplet contact pads.

In certain embodiments, the chiplet contact pads are located on a side of the chiplet opposite the connection posts.

In certain embodiments, the printable component includes a second dielectric layer disposed at least partly over the first dielectric layer.

In certain embodiments, the second dielectric layer is transparent, and the component is a light-emitting component that emits light through the second dielectric layer.

In certain embodiments, the connection post is a multi-layer connection post.

In certain embodiments, the printable component has at least one of a width, length, and height from 2 to 5 µm, 5 to 10 µm, 10 to 20 µm, or 20 to 50 µm.

In certain embodiments, the printable component is a light-emitting diode, photo-diode, or transistor.

In some aspects, the present disclosure is directed to a destination substrate for receiving transfer-printed printable components, including: a substrate having a surface; and a plurality of non-planar backplane contact pads formed on or in the substrate, wherein the non-planar backplane contact pads have a perimeter portion surrounding a central portion, and wherein the perimeter portion is closer to the surface than the central portion (e.g., the central portion is recessed).

In certain embodiments, at least one of (i), (ii), and (iii) is true: (i) the backplane contact pad has a first conductive layer and a second conductive layer over the first conductive layer and the second conductive layer has a lower melting temperature than the first conductive layer, (ii) wherein the backplane contact pad is coated with a non-conductive layer, and (iii) wherein the backplane contact pad is formed on a compliant non-conductive layer.

In certain embodiments, the second conductive layer is a solder.

In certain embodiments, the non-conductive layer is a polymer or an adhesive or the compliant non-conductive layer is a polymer.

In certain embodiments, the compliant non-conductive layer is a polymer.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, the printable component has at least one of a width, length, and height from 2 to 5 µm, 5 to 10 µm, 10 to 20 µm, or 20 to 50 µm.

In certain embodiments, the printable components are light-emitting diodes, photo-diodes, or transistors.

In some aspects, the present disclosure is directed to a printed structure comprising a destination substrate and one or more printable components, the printable components comprising a chiplet having a semiconductor substrate and a plurality of electrical connections, wherein: each electrical connection comprises an electrically conductive connection post protruding from the semiconductor substrate, the destination substrate has two or more backplane contact pads on a backplane surface and each connection post is in contact with, extends into, or extends through a backplane contact pad of the destination substrate to electrically connect the backplane contact pads to the connection posts, the backplane contact pads are non-planar, have a perimeter portion surrounding a central portion, and wherein the perimeter portion is closer to the backplane surface than the central portion, and the connection posts are inserted into the backplane contact pads.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, each printable component of the one or more printable components is a light-emitting diode, photo-diode, or transistor.

In some aspects, the present disclosure is directed to a printed structure including: a destination substrate; one or more printable components, the printable components comprising a chiplet having a semiconductor substrate and a plurality of electrical connections, wherein: each electrical connection comprises an electrically conductive connection post protruding from the semiconductor substrate, and the destination substrate having two or more backplane contact pads and each connection post is in contact with, extends into, or extends through a backplane contact pad of the destination substrate to electrically connect the backplane contact pads to the connection posts; and an adhesive material located within a volume between the connection posts of a printable component.

In certain embodiments, the adhesive material underfills the volume and applies compression between the printable component and the destination substrate.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, each printable component of the one or more printable components is a light-emitting diode, photo-diode, or transistor.

In certain embodiments, a layer in contact with the semiconductor substrate is between the connection post and the semiconductor substrate.

In certain embodiments, the connection post has a height that is greater than its base width.

In certain embodiments, the connection post has a base width that is greater than its peak width.

In certain embodiments, the connection post has a base area that is greater than its peak area.

In certain embodiments, a layer in contact with the semiconductor substrate is between the connection post and the semiconductor substrate.

In certain embodiments, a layer in contact with the semiconductor substrate is between the connection post and the semiconductor substrate.

In certain embodiments, a layer in contact with the semiconductor substrate is between the connection post and the semiconductor substrate.

In certain embodiments, a layer in contact with the semiconductor substrate is between the connection post and the semiconductor substrate.

In some aspects, the present disclosure is directed to a method of making a printed structure comprising providing a destination substrate, contact pads disposed on or in the destination substrate, and a layer of adhesive disposed on the destination substrate. A stamp with a component adhered to the stamp is provided. The component comprises a stamp side in contact with the stamp and a post side opposite the stamp side, a circuit, and connection posts extending from the post side. Each connection post is electrically connected to the circuit. The component is pressed into contact with the adhesive layer to adhere the component to the destination substrate to form the printed structure having a volume defined between the component and the destination substrate. The stamp is removed, and the printed structure is processed to fill or reduce the volume.

The adhesive layer can be disposed as a patterned or an unpatterned adhesive layer. The adhesive layer can be patterned without crosslinking, thereby facilitating adhesion between the adhesive layer and the component. The adhesive layer can be disposed as a pattern such that at least a portion of the contact pads are uncovered or disposed as a pattern such that no adhesive is between the connection posts and contact pads, or both. The step of processing the printed structure can comprise changing the pattern of the adhesive from a first shape with an area parallel to the destination substrate and a height perpendicular to the destination substrate to a second shape having a height smaller than the height of the first shape and an area larger than the area of the first shape.

In some embodiments, the step of pressing the connection posts into the adhesive layer contacts each of the connection posts to one of the contact pads. In some embodiments, the step of pressing the connection posts into the adhesive layer does not contact each of the connection posts to one of the contact pads.

The adhesive layer can be provided with a thickness over the destination substrate that is less than a distance between the post side and the destination substrate after the step of pressing the connection posts into the adhesive layer (e.g., with a thickness that is less than a height of one or more of the connection posts). The adhesive layer can be provided with a thickness over the destination substrate that is greater than or equal to a distance between the post side and the destination substrate after the step of pressing the connection posts into the adhesive layer (e.g., with a thickness that is greater than a height of one or more of the connection posts).

Some embodiments comprise curing the adhesive. The adhesive can be cured in a pattern defined by spacing of components over the destination substrate. The adhesive can be a positive resist. The method can comprise removing the adhesive from the area over the destination substrate that is not between the component and the destination substrate. The adhesive can be or comprise, for example, one or more of polybenzoxazole (PBO), an epoxy, a polyimide, a photoresist, and an acrylic.

According to some embodiments, an amount of volumetric contraction is greater than an amount of thermal expansion of the adhesive at an upper working temperature of the adhesive. In some embodiments, the amount of volumetric contraction is greater than the thermal expansion of the adhesive over the working temperature of the adhesive. The volume can be partially unfilled (e.g., prior to the processing). The volume can be filled with the adhesive and the step of processing the printed structure can comprise reducing the volume of the adhesive (e.g., by shrinking the adhesive). The step of processing the printed structure can comprise infiltrating the adhesive from around the component into the volume. The step of processing the printed structure can comprise moving the component toward the destination substrate. The step of processing the printed structure comprises wicking the adhesive over or on one or more surfaces of one or more of the component, the contact pads, and the destination substrate into the volume. The step of processing the printed structure comprises at least temporarily changing a viscosity, a temperature, or both a viscosity and a temperature of the adhesive. The adhesive comprises a solvent when provided and the step of processing the printed structure comprises changing a concentration of the solvent in the adhesive. According to some embodiments, processing the printed structure comprises elevating a temperature of the printed structure to increase a density of the adhesive, thereby reducing the volume.

The adhesive layer can comprise one or more compounds. Processing the printed structure can comprise elevating a temperature of the printed structure to volatilize the one or more compounds, thereby reducing the volume. The step of processing the printed structure can comprise gradient heating the printed structure.

According to some embodiments, each of the connection posts is electrically conductive and comprises a sharp point. Each of the connection posts can be electrically conductive and can have a height that is greater than a base width, and a base area that is greater than a peak area. Each of the connection posts can comprise a conductive metal.

The component can be or comprise an active component. The component can be or comprise an integrated circuit, a transistor, or an LED. The component can have at least one dimension from 1 micron to 200 microns.

In some embodiments, the method comprises providing more than two contact pads, a plurality of components, or both. In some embodiments, the method comprises providing more than two contact pads, wherein at least one of the connection posts is pressed into each of the more than two contact pads. In some embodiments, the stamp is provided with a plurality of components adhered to the stamp, each of the plurality of components having a stamp side in contact with the stamp and a post side opposite the stamp side and comprising a respective circuit and respective connection posts extending from the post side, each of the respective connection posts electrically connected to the respective circuit, and the method comprises: pressing each of the plurality of components into contact with the adhesive layer to adhere the plurality of components to the destination substrate to form the printed structure having a respective volume defined between each of the plurality of components and the destination substrate. According to some embodiments, the component comprises more than two connection posts extending from the post side, each connection post electrically connected to the circuit.

In some aspects, the present disclosure is directed to an electrical interconnection structure comprising a destination substrate, contact pads disposed on or in the destination substrate, and a patterned layer of adhesive disposed on the destination substrate. A component comprises a post side and connection posts extending from the post side, each connection post electrically connected to the contact pads, and at least a portion of the post side in contact with the patterned layer of adhesive. The patterned layer of adhesive can occupy a portion of a volume between the component and the destination substrate and the patterned layer of adhesive can press the connection posts to the contact pads. In some embodiments, the patterned layer of adhesive does not contact the connection posts.

The present disclosure provides, inter alia, structures and methods that enable the construction of electrical interconnections between small integrated circuits that are transfer printed on a destination substrate. The electrical interconnection process is simple and inexpensive requiring fewer process steps than known alternative methods.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 3 is a cross section of a component comprising electrically shorted redundant connection posts, according to illustrative embodiments of the disclosure;

FIG. 4 is a cross section of a component comprising electrically shorted redundant connection posts with different heights, according to illustrative embodiments of the disclosure;

FIGS. 6-9 are printed structures comprising connection posts, according to illustrative embodiments of the disclosure.

FIGS. 13-20 are cross sections illustrating steps of making a printable component, according to illustrative embodiments of the disclosure;

Figure 1:
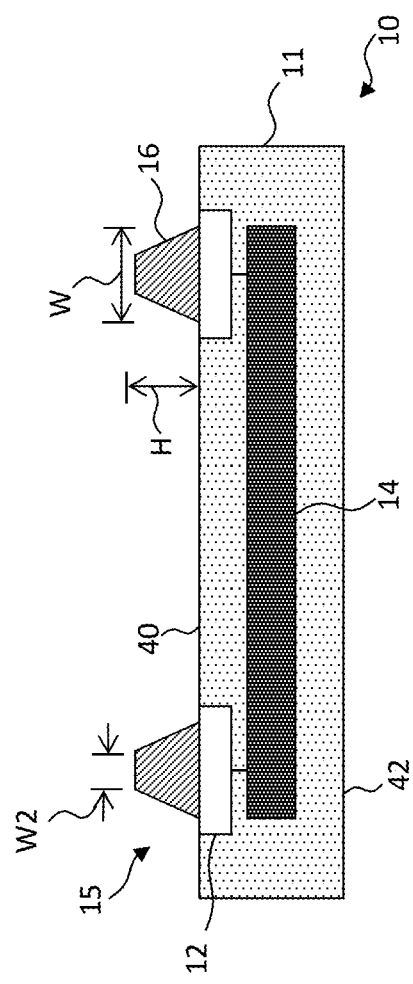
FIG. 1 is a cross section of a component, according to illustrative embodiments of the disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

The present disclosure provides, inter alia, structures and methods for electrically connecting relatively small electrical components such as integrated circuit chiplets (or components including integrated circuit chiplets), for example, to a relatively large destination substrate. Using embodiments of structures and methods disclosed herein, electrical connection can be made in an efficient and cost-effective way. Referring to the cross section of FIG. 1, in some embodiments, a component 10 includes a plurality of electrical connections 15 on a process side 40 opposed to a back side 42 of the component 10. Each electrical connection 15 includes an electrically conductive connection post 16 protruding from the process side 40. The electrical connection 15 can also include a component contact pad 12 on which the connection post 16 is disposed and to which the connection post 16 is electrically connected.

The component 10 can be an active component, for example including one or more active elements such as electronic transistors or diodes or light-emitting diodes and photodiodes that produce an electrical current in response to ambient light. Alternatively, the component 10 can be a passive component, for example including one or more passive elements such as resistors, capacitors, or conductors. In some embodiments, the component 10 is a compound component 10 that includes both active and passive elements. The component 10 can be a semiconductor device having one or more semiconductor layers 11, such as an integrated circuit. The component 10 can be an unpackaged die. In some embodiments, the component 10 is a compound element having a plurality of active or passive elements, such as multiple semiconductor devices with separate substrates, each with one or more active elements or passive elements, or both. In certain embodiments, the plurality of elements is disposed and interconnected on a compound element substrate separate from the substrates of any semiconductor devices or a different substrate. The compound element can be micro transfer printed itself after the elements have been arranged thereon. The components 10 can be electronic processors, controllers, drivers, light-emitting diodes, photodiodes, light-control devices, or light-management devices.

The components 10 made by methods according to certain embodiments can include or be a variety of chiplets having semiconductor structures, including a diode, a light-emitting diode (LED), a transistor, or a laser. Chiplets are small integrated circuits and can be unpackaged dies released from a source wafer and can be micro transfer printed. Components 10 (or chiplets 70, for example, included in a component 10) can have at least one of a width, a length, and a height from 2 to 50 μm (e.g., 2 to 5 μm, 5 to 10 μm, 10 to 20 μm, or 20 to 50 μm). Chiplets 70 can have a doped or undoped semiconductor substrate thickness of 2 to 50 μm (e.g., 2 to 5 μm, 5 to 10 μm, 10 to 20 μm, or 20 to 50 μm). The chiplets 70 or components 10 can be micro-light-emitting diodes with a length greater than width, for example having an aspect ratio greater than or equal to 2, 4, 8, 10, 20, or 50 and component contact pads 12 that are adjacent to the ends of the printable semiconductor components 10 along the length of the printable semiconductor components 10. This structure enables low-precision manufacturing processes to electrically connect wires to the f component contact pads 12 without creating registration problems and possible unwanted electrical shorts or opens.

The components 10 can include active elements such as electronic circuits 14 formed using lithographic processes and can include passive elements such as electrical connections, e.g., wires, to the component contact pads 12 and connection posts 16. In certain embodiments, the component contact pads 12 are planar electrical connections formed on the process side 40 of the component 10 and source wafer. Such component contact pads 12 are typically formed from metals such as aluminum or polysilicon using masking and deposition processes used in the art. In certain embodiments, the component contact pads 12 are electrically connected to the circuit 14 with wires 13. In some embodiments the component contact pads 12 are directly electrically connected to the circuit 14 without intervening wires. In some embodiments, component contact pads 12 and the circuit 14, together with other functional structures formed in the active layer on the source wafer make up the component 10, or chiplet.

In some embodiments, the contact pads 12 are omitted and the connection posts are electrically connected to the circuit 14 with the wires 13. In some embodiments, each contact pad 12 and its respective connection post 16 are a single component (e.g., formed together as contact terminal).

In some embodiments, the components 10 are small integrated circuits, for example chiplets, having a thin substrate with a thickness of only a few microns, for example less than or equal to 25 microns, less than or equal to 15 microns, or less than or equal to 10 microns, and a width or length of 5-10 microns, 10-50 microns, 50-100 microns, or 100-1000 microns. Such chiplet components 10 can be made in a source semiconductor wafer (e.g., a silicon or GaN wafer) having a process side 40 and a back side 42 used to handle and transport the wafer. Components 10 are formed using lithographic processes in an active layer on or in the process side 40 of the source wafer. An empty release layer space is formed beneath the components 10 with tethers connecting the components 10 to the source wafer in such a way that pressure applied against the components 10 breaks the tethers to release the components 10 from the source wafer. Methods of forming such structures are described, for example, in the paper "AMOLED Displays using Transfer-Printed Integrated Circuits" and U.S. Pat. No. 8,889,485 referenced above. Lithographic processes for forming components 10 in a source wafer, for example transistors, wires, and capacitors, can be used in the integrated circuit art.

According to some embodiments, the native source wafer can be provided with the components 10, release layer, tethers, and connection posts 16 already formed, or they can be constructed as part of a method in accordance with some embodiments.

Figure 30:
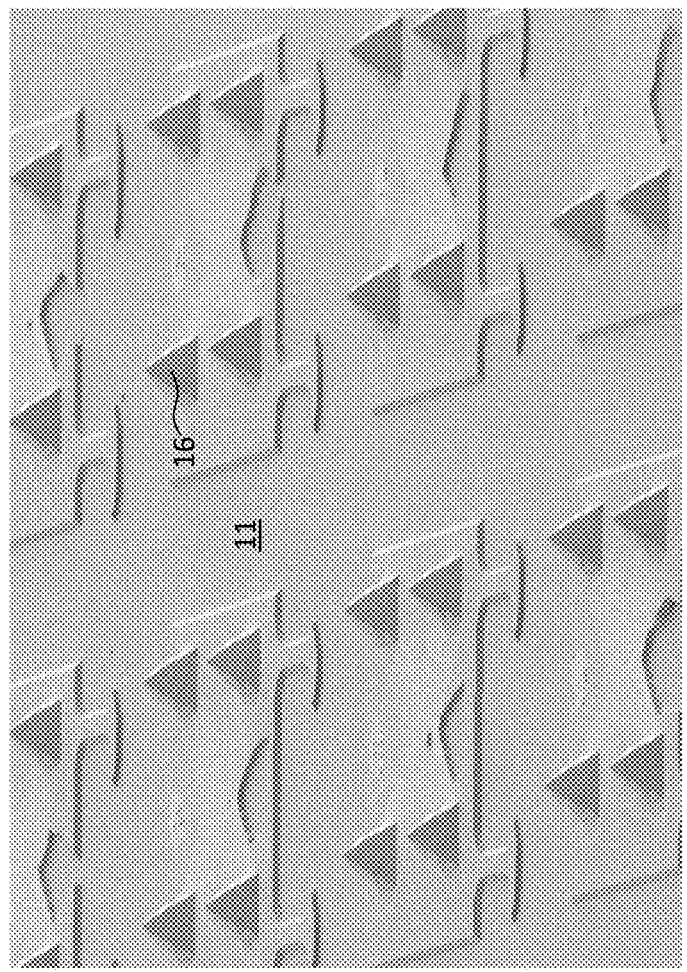
FIG. 30 is a micrograph of connection posts formed on a substrate, according to illustrative embodiments of the disclosure.

Connection posts 16 are electrical connections formed on the process side 40 of the component 10 that extend generally perpendicular to the surface of the process side 40. Such connection posts 16 can be formed from metals such as aluminum, titanium, tungsten, copper, silver, gold, or other conductive metals. The connection posts 16 can be formed by repeated masking and deposition processes that build up three-dimensional structures. In some embodiments, the connection posts 16 are made of one or more high elastic modulus metals, such as tungsten. As used herein, a high elastic modulus is an elastic modulus sufficient to maintain the function and structure of the connection post 16 when pressed into a backplane contact pads 22, as described further below with respect to FIGS. 5-9. FIG. 30 is a micrograph of connection posts 16 made on a semiconductor substrate.

In certain embodiments, the electrical connections 15 include patterned metal layers forming component contact pads 12. The contact pads 12 can be made using integrated circuit photolithographic methods. Likewise, the connection posts 16 can be made by etching one or more layers of metal evaporated or sputtered on the process side 40 of the component 10. Such structures can also be made by forming a layer above the component 10 surface, etching a well into the surface, filling it with a conductive material such as metal, and then removing the layer. In some embodiments, the connection posts 16 are electrically connected to the circuit 14 and the connection posts 16 and the circuit 14, together with other functional active or passive structures formed in the active layer on the source wafer, make up the component 10.

The connection posts 16 can have a variety of aspect ratios and typically have a peak area smaller than a base area. The connection posts 16 can have a sharp point for embedding in or piercing backplane contact pads 22 (described further below). Components 10 with protruding connection posts 16 generally are discussed in U.S. Pat. No. 8,889,485 whose contents are incorporated by reference herein in their entirety.

As shown in the Figures, the connection posts 16 can have a base width W representing a planar dimension of the connection post 16 on the process side 40 and a height H representing the extent of the connection post 16 from the process side 40 to the peak of the connection post 16. The peak of the connection post 16 can have a width W2 less than W that, in some embodiments, approaches zero so the connection post 16 has a sharp point. The base of the connection post 16 can have a base area in contact with the process side 40 and a peak area smaller than the base area. The connection post 16 can also have a height H greater than a base dimension.

Figure 2:
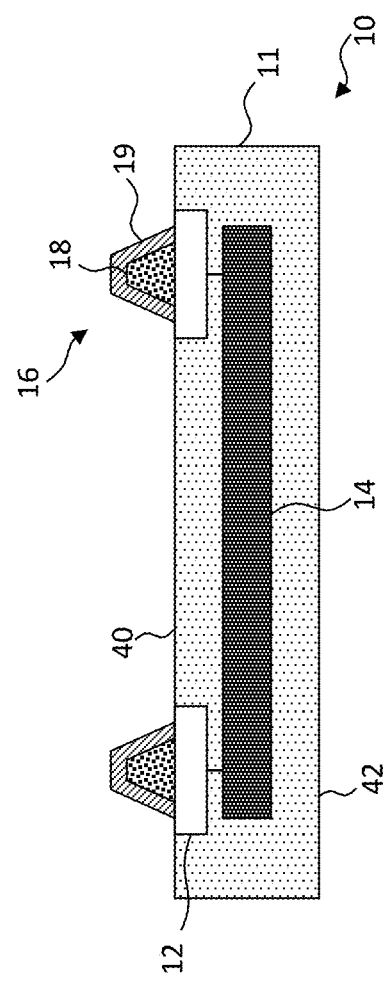
FIG. 2 is a cross section of a component comprising multi-layer connection posts, according to illustrative embodiments of the disclosure.

Referring to FIG. 2, in some embodiments, the connection posts 16 include a post material 18 coated with an electrically conductive material 19 different from the post material 18. The post material 18 can be an electrically conductive metal or a doped or undoped semiconductor or an electrically insulating polymer, for example a resin, cured, resin, or epoxy and can have any of a variety of hardness or elastic modulus values. In some embodiments, the post material 18 is softer than the conductive material 19 so that the conductive material 19 can crumple when the connection post is under mechanical pressure. Alternatively, the conductive material 19 is softer than the post material 18 so that it deforms before the post material 18 when under mechanical pressure. By deform is meant that the connection posts 16 or the backplane contact pads 22 or conductive material 19 change shape as a consequence of the transfer printing.

The multi-layer connection post 16 can be made using photolithographic methods, for example coating and then pattern-wise curing materials such as resins or metals that can be etched. The connection post 16 or post material 18 can be a semiconductor materiel, such as silicon or GaN, formed by etching material from around the connection post 16. Coatings, such as the conductive material 19 can be evaporated or sputtered over the post material 18 structure and then pattern-wise etched to form the multi-layer connection post 16 of FIG. 2. The conductive material 19 can be a solder or other metal or metal alloy that flows under a relatively low temperature, for example less than 120 degrees C. In particular, the conductive material 19 can have a melting point less than the melting point of the post material 18.

Referring next to FIG. 3, in some embodiments, two or more connection posts 16 are directly electrically connected. As shown in FIG. 3, two or more connection posts 16 together form groups 17 of connection posts 16. The connection posts 16 in a common group 17 are electrically connected or shorted, for example by a component contact pad 12. In a useful arrangement, the connection posts 16 in a common group 17 are separated by a distance D1 that is less than the distance D2 between connection posts 16 in different groups 17 so that the connection posts 16 within a group 17 are located closer together than connection posts 16 in different groups 17. In some embodiments, referring to FIG. 4, a short connection post 16A has a different height H than another connection post 16, for example another connection post 16 within a common group 17 with the short connection post 16A. Multiple connection posts 16 and connection posts 16 having different heights that are electrically connected provide a redundant means for connection to a common electrical connection. As those skilled in the art will understand, it is important that electrical connections between the components 10 and an external electrical structure such as a backplane are reliable and effective. By providing multiple connection posts 16 and connection posts 16 with different structures, such as heights, that are electrically connected in the component 10, the likelihood of an electrical connection failure between the component 10 and an external device are reduced.

Figure 5:
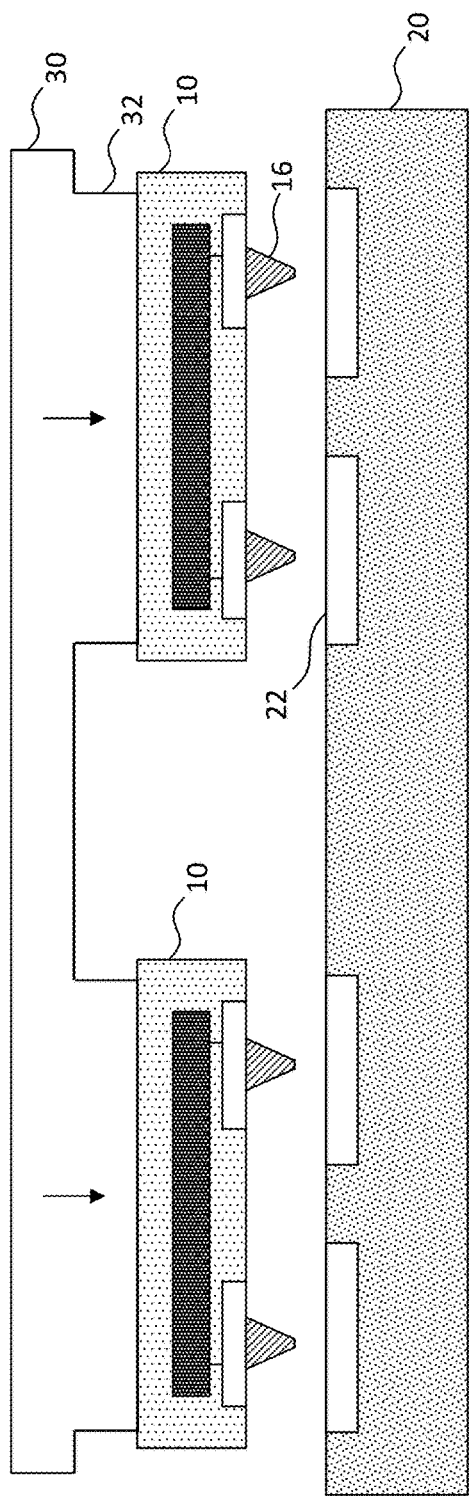
FIG. 5 is a cross section illustrating micro-transfer printing a component onto a destination substrate, according to illustrative embodiments of the disclosure.
Figure 6:
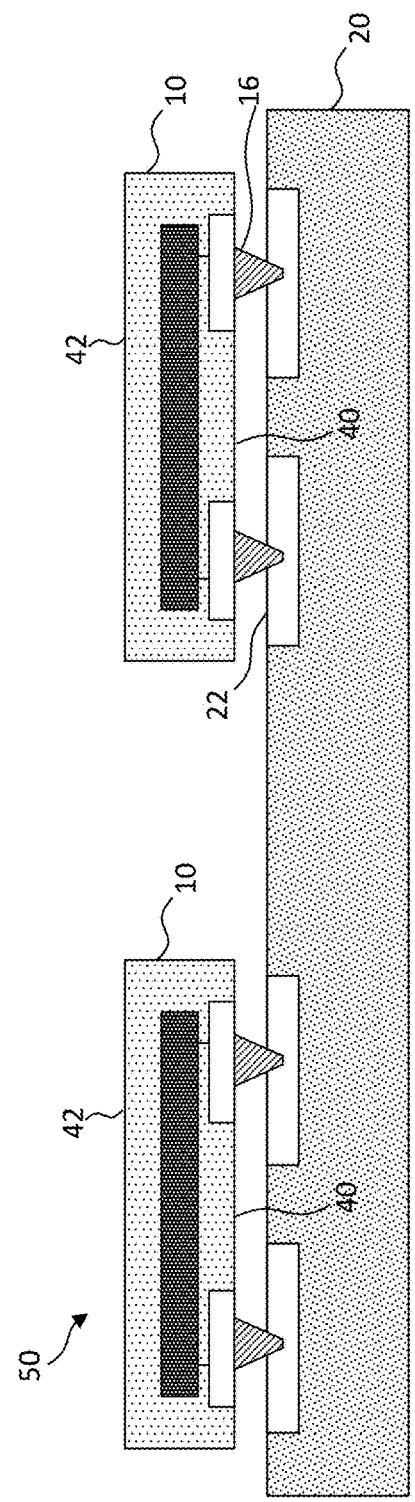

Referring next to FIGS. 5 and 6, in some embodiments, a printed structure 50 includes a destination substrate 20 that is a different substrate than the substrates of the components 10 and is not native to the components 10. The destination substrate 20 can be a backplane and has one or more components 10 and two or more backplane contact pads 22. Each connection post 16 is in contact with, extends into, or extends through a backplane contact pad 22 of the destination substrate 20 to electrically connect the backplane contact pads 22 to the connection posts 16. The backplane contact pads 22 can be electrically conductive and connected through wires or conductive traces to other components or structures on the destination substrate 20.

The backplane contact pads 22 can be made of a relatively soft metal, such as tin, solder, or tin-based solder, to assist in forming good electrical contact with the connection posts 16 and adhesion with the components 10. As used herein, a soft metal may refer to a metal into which a connection post 16 can be pressed to form an electrical connection between the connection post 16 and the backplane contact pad 22. In this arrangement, the backplane contact pad 22 can plastically deform and flow under mechanical pressure to provide a good electrical connection between the connection post 16 and the backplane contact pad 22.

In some embodiments, the connection posts 16 can include a soft metal and the backplane contact pads 22 include a high elastic modulus metal. In this arrangement, the connection posts 16 can plastically deform and flow under mechanical pressure to provide a good electrical connection between the connection post 16 and the backplane contact pads 22.

If an optional adhesive layer is formed on the destination substrate 20, the connection posts 16 can be driven through the adhesive layer to form an electrical connection with the backplane contact pads 22 beneath the adhesive layer. The adhesive layer can be cured to more firmly adhere the components 10 to the destination substrate 20 and maintain a robust electrical connection between the connection posts 16 and backplane contact pads 22 in the presence of mechanical stress. The adhesive layer can undergo some shrinkage during the curing process that can further strengthen the electrical connectivity and adhesion between the connection post 16 and the backplane contact pads 22.

As shown in FIG. 5, a transfer stamp 30 has a plurality of pillars 32 formed thereon and spatially aligned to the components 10. The transfer stamp 30 can be made of an elastomeric material, such as PDMS. The pillars 32 protrude from and are spatially arranged on the process side 40 of the transfer stamp 30 so that each pillar 32 can be aligned with a component 10. The pillars 32 are in contact with the components 10 and are moved in alignment with and towards the destination substrate 20 so that the connection posts 16 of the components 10 come in contact with the backplane contact pads 22 of the destination substrate 20 (FIG. 6).

In some embodiments, the connection posts 16 of the components 10 are in contact with, are embedded in, or pierce the backplane contact pads 22 of the destination substrate 20. FIG. 6 shows a connection post 16 embedded in a backplane contact pad 22; in some embodiments, either or both one or more of the connection posts 16 and the backplane contact pads 22 are deformed or crumpled into a non-planar shape or are deformed so that the surfaces of the connection posts 16 and the backplane contact pads 22 change shape on contact with each other. FIG. 7A illustrates a deformed or crumpled backplane contact pad 22A (connected to component 10A). FIG. 7B illustrates a connection post 16 piercing a backplane contact pad 22 (connected to component 10B). FIG. 8A illustrates deformed or crumpled connection posts 16B embedded in a backplane contact pad 22 (connected to component 10C). FIG. 8B illustrates a deformed or crumpled connection post 16B in contact with a backplane contact pad 22 (connected to component 10D). The deformation or crumpling can improve the electrical connection between the connection posts 16 and the backplane contact pads 22 by increasing the surface area that is in contact between the connection posts 16 and the backplane contact pads 22. To facilitate deformation, in some embodiments, the two or more connection posts 16 have a composition softer than that of the backplane contact pads 22 or the backplane contact pads 22 have a composition softer the two or more connection posts 16.

Figure 9:
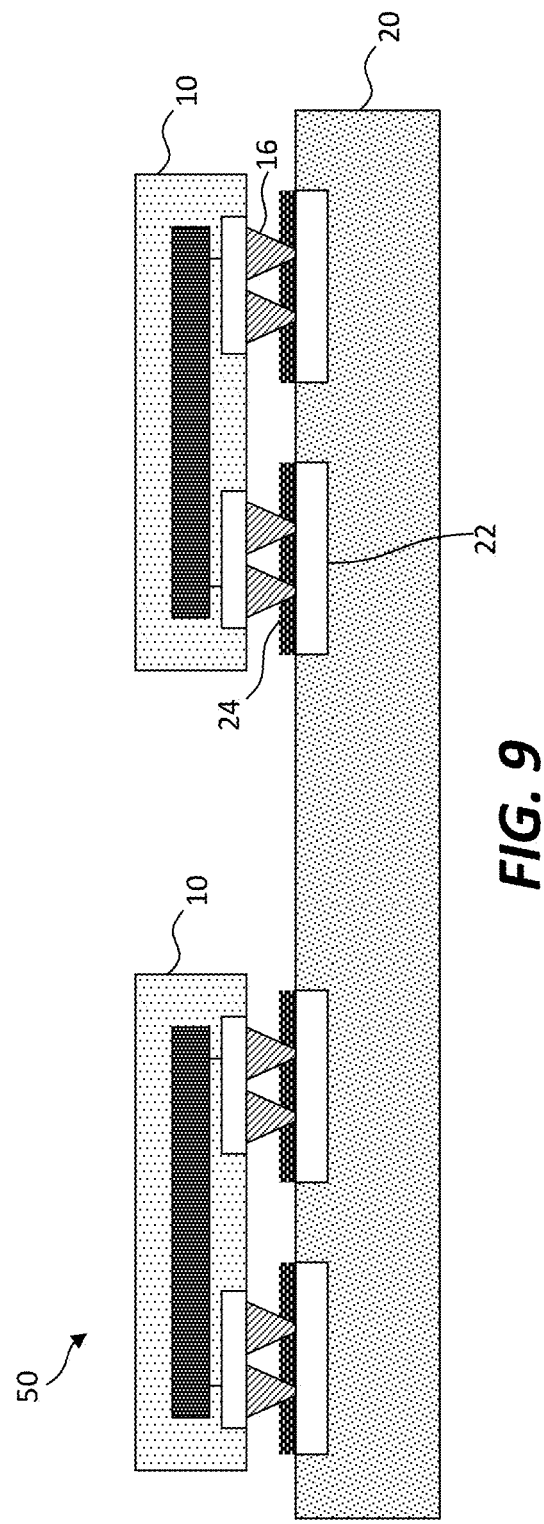

As noted above with reference to FIG. 2, a multi-layer connection post can include a conductive material 19 coated over a post material 18. The conductive material 19 can be a solder that is melted to promote the electrical connection between the connection posts 16 and the backplane contact pad 22. In some embodiments, for example as illustrated in FIG. 9, the backplane contact pads 22 include or are coated with a conductive material or solder 24. The connection posts 16 can contact, be embedded in, or pierce the conductive material 24. In some embodiments, the backplane contact pad 22 has a first conductive layer and a second conductive layer over the first conductive layer, and the second conductive layer has a lower melting temperature than the first conductive layer. With a subsequent heat treatment, the solder can reflow and promote the electrical connection between the connection posts 16 and the backplane contact pads 22. In some embodiments, both the connection posts 16 and the backplane contact pads 22 include a layer of conductive material such as solder or have a layer of conductive material other than the material making up the connection posts 16 or backplane contact pads 22 that electrically connects the backplane contact pad 22 to the connection post 16. As noted above, a heat treatment can also serve to weld the backplane contact pad 22 to the connection post 16. Welding can be facilitated by providing a common material on the surfaces of the connection posts 16 and the backplane contact pads 22.

Figure 22:
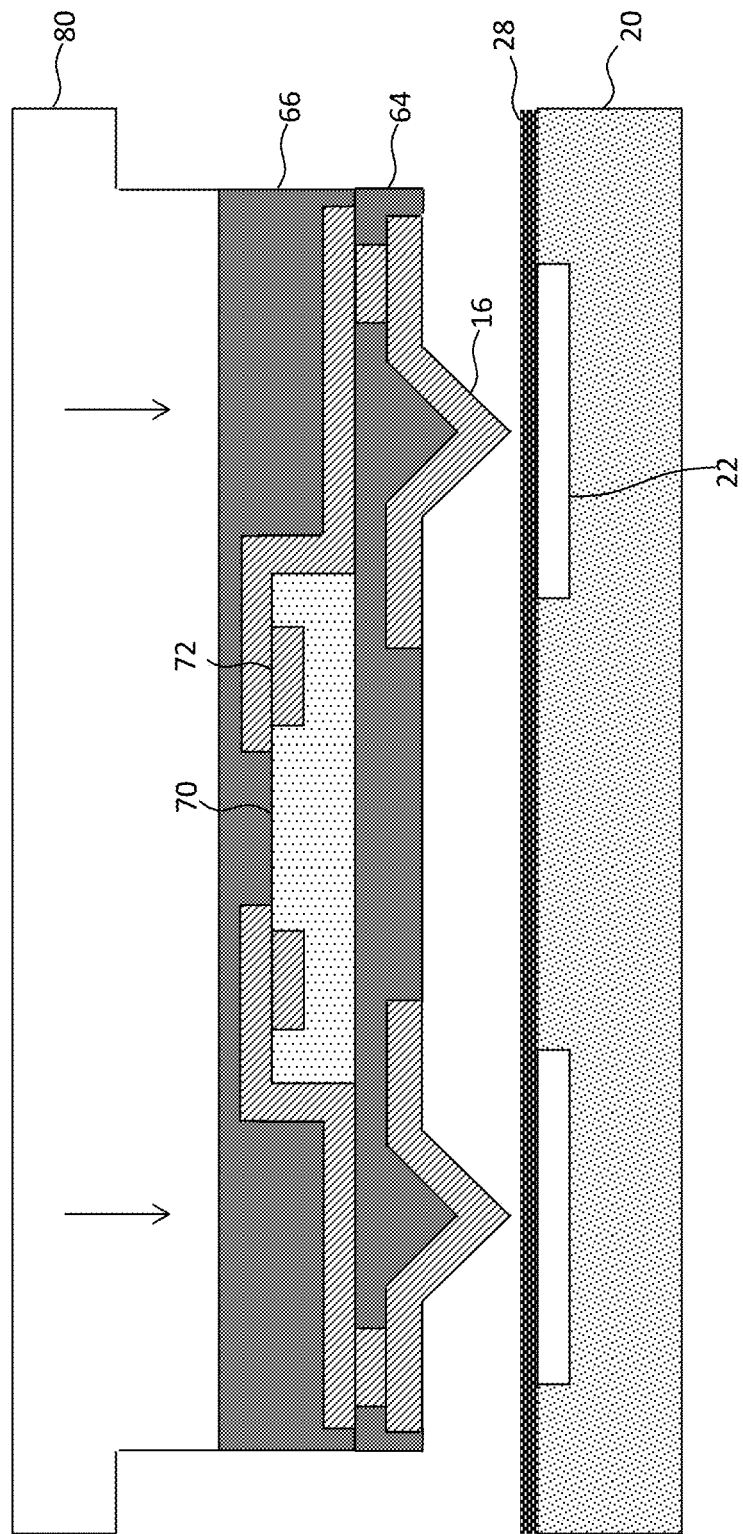

In some embodiments, the backplane contact pads are coated with an optional polymer layer that can extend over the destination substrate (for example as shown in FIG. 22 described further below). The connection posts 16 of the printable components are driven through the polymer layer to make electrical contact with the backplane contact pads 22. The polymer layer can protect the backplane contact pads 22 and serve to embed the connection posts 16 in the backplane contact pads 22 by adhering to the connection posts 16. Alternatively, a compliant polymer layer is formed beneath the backplane contact pads 22 to facilitate the mechanical contact made when the connection posts 16 are embedded in the backplane connection pads 22. For example, a metal or metal alloy containing as gold, tin, silver, or aluminum, can be formed over a polymer layer or a polymer layer coated over a metal or metal alloy containing gold, tin, silver, or aluminum. The compliant polymer layer can also serve to adhere the connection posts 16 to the backplane contact pads 22.

As shown in FIGS. 3 and 4, in some embodiments, two or more connection posts 16 are electrically shorted in a component 10. When electrically connected to a backplane contact pad 22, the two or more connection posts 16 are electrically connected to one backplane contact pad 22 as shown in FIGS. 7-9. Such redundant electrical connections reduce contact failures between the connection posts 16 and the backplane contact pads 22. To facilitate such electrical connections and to prevent shorting between adjacent backplane contact pads 22, as shown and described with respect to FIG. 3, the connection posts 16 in a common group 17 are separated by a distance D1 that is less than the distance D2 between connection posts 16 in different groups 17 so that the connection posts 16 within a group 17 are located closer together than connection posts 16 in different groups 17. Furthermore, as shown in FIGS. 7-9, in some embodiments, the distance between two or more connection posts 16 (e.g., D1, FIG. 3) is less than a width or length of the electrical contact in a direction parallel to the destination substrate 20. Thus, in some embodiments, the connection posts 16 are disposed in groups 17, the connection posts 16 within a group 17 are electrically connected to a common backplane contact pad 22 and the connection posts 16 in different groups 17 are electrically connected to different backplane contact pads 22.

Figure 10:
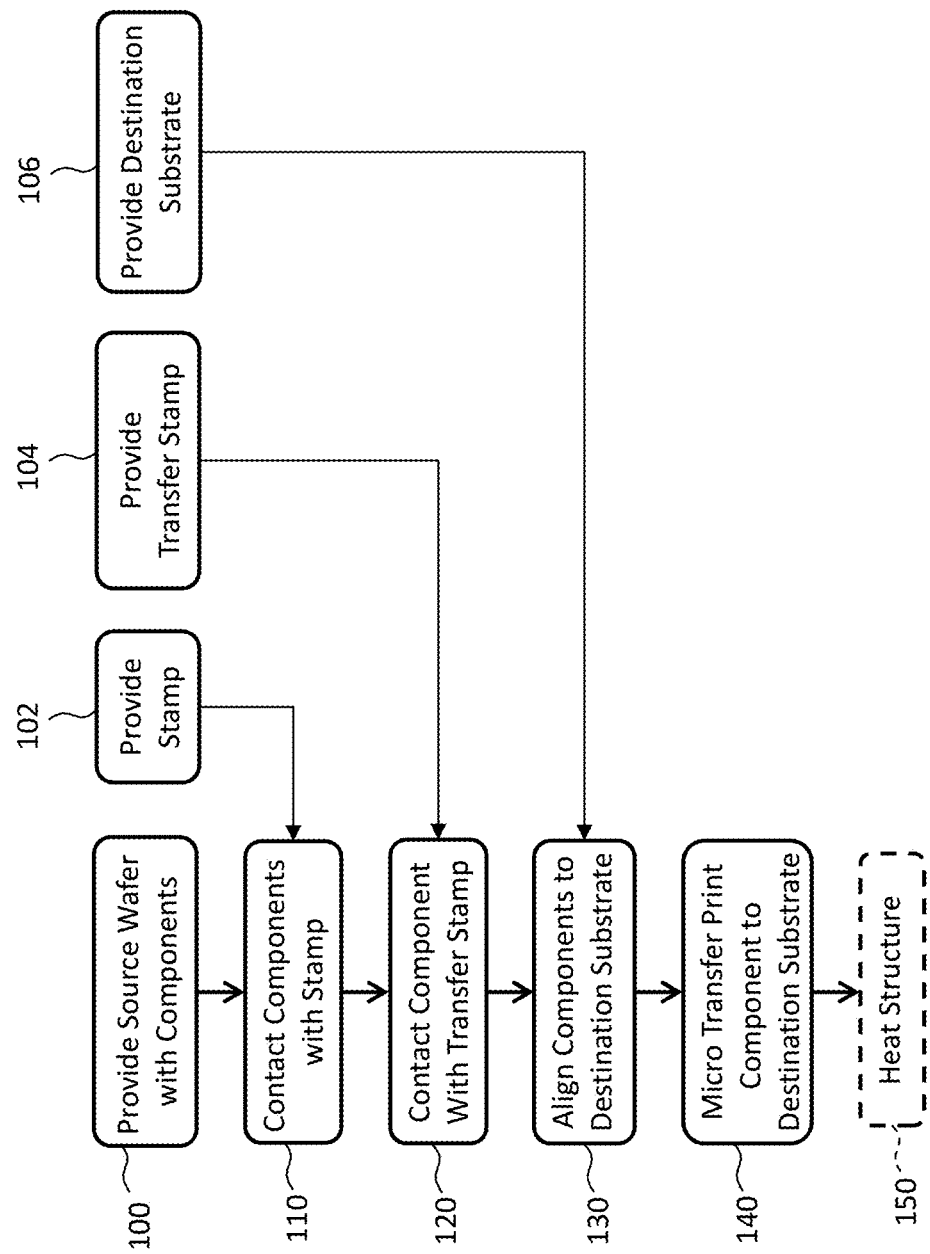
FIGS. 10-12 are flow charts illustrating methods according to illustrative embodiments of the disclosure.

Referring next to FIG. 10, in a method, a source wafer is provided with components 10 in step 100, a stamp is provided in step 102, a transfer stamp 30 is provided in step 104, and a destination substrate is provided in step 106. In some embodiments, the components 10 on the native source wafer are disposed in an array that corresponds to pillars 32 of the stamp. In some embodiments, a subset of the components 10 spatially correspond to the pillars 32.

The pillars 32 of the stamp are pressed against corresponding components 10 into the release layer to adhere the components 10 to the pillars 32 to transfer the pressed components 10 from the source wafer to the stamp pillars 32 in step 110. By pressing the stamp against the components 10, the tethers are broken and the components 10 are adhered to the pillars 32, for example by van der Waal's forces. The stamp is removed from the source wafer, leaving the components 10 adhered to the pillars 32. In some embodiments, the pillars 32 have a planar dimension, for example a width, smaller than the distance D2 between the connection posts 10 on the components 10. Thus, the pillars 32 of the stamp fit between the connection posts 16 to make intimate contact with the surface of the components 10 to enhance the adhesive effect of the van der Waal's forces and improve adhesion between the components 10 and the pillars 32. If the pillars 32 were located over the connection posts 16, the connection posts 16 would form a standoff between the process side 40 of the components 10 and the pillars 32, greatly decreasing the attractive force of the van der Waal's force between the components 10 and the pillars 32.

Referring again to step 104 of FIG. 10, a transfer stamp 30 having pillars 32 is provided. In some embodiments, the pillars 32 of the transfer stamp 30 are made of the same material as the pillars 32 of the stamp. In some embodiments, the pillars 32 of the transfer stamp 30 are made of a different material than the pillars 32 of the stamp. In some embodiments, the pillars 32 of the transfer stamp 30 form vacuum collets. If the pillars 32 of the stamp and transfer stamp 30 are made of the same material, the pillars 32 of the transfer stamp 30 can have a larger surface area than the pillars 32 of the stamp.

In step 120, the components 10 adhered to the pillars 32 of the stamp are brought into contact with the pillars 32 of the transfer stamp 30. Because the area of the pillars 32 of the transfer stamp 30 is larger than the area of the pillars 32 of the stamp, the van der Waal's forces between the components 10 and the pillars 32 of the transfer stamp 30 is greater than the van der Waal's forces between the components 10 and the pillars 32 of the stamp. Therefore, the components 10 will transfer to the pillars 32 of the transfer stamp 30 when the stamp is removed leaving the components 10 adhered to the pillars 32 of the transfer stamp 30. If the pillars 32 of the stamp and transfer stamp 30 are made of different material, the pillars 32 of the transfer stamp 30 should have a surface area sufficient to transfer the components 10 to the pillars 32 of the transfer stamp 30 from the pillars 32 of the stamp. If the pillars 32 of the transfer stamp 30 form a vacuum collet, the vacuum collet must be small enough to contact single components 10 and the vacuum must be strong enough to remove the contacted single component 10 from the pillars 32 of the stamp and transfer it to the pillars 32 of the transfer stamp 30.

The stamp can have more pillars 32 than the transfer stamp 30 has. Thus, not all of the components 10 on the pillars 32 of the stamp will transfer to the pillars 32 of the transfer stamp 30. The transfer stamp 30 can be laterally translated with respect to the stamp to sequentially transfer subsets of the components 10 from the pillars 32 of the stamp to the pillars 32 of the transfer stamp 30. Since the pillars 32 of the stamp are spatially aligned to the components 10 on the source wafer, to enable a sparser distribution of components 10 on the transfer stamp 30, the transfer stamp 30 can have fewer pillars 32 than the stamp so as to spatially distribute the components 10 farther apart.

The transfer stamp 30 can include pillars 32 that form vacuum collets. By applying a vacuum (or partial vacuum) to the vacuum collets, the components 10 can be transferred to the transfer stamp 30. The transfer stamp 30 is aligned with the stamp, vacuum is applied to the vacuum collets, and the transfer stamp 30 is removed from the stamp, leaving the components 10 adhered to the pillars 32 of the transfer stamp 30.

The spatial distribution of the components 10 is a matter of design choice for the end product desired. In one embodiment, all of the components 10 in a source wafer array are transferred to the stamp. In some embodiments, a subset of the components 10 in the source wafer array is transferred. Similarly, in some embodiments, all of the components 10 on the pillars 32 of the stamp array are transferred to the pillars 32 of the transfer stamp 30. In some embodiments, a subset of the components 10 on the pillars 32 of the stamp are transferred to the pillars 32 of the transfer stamp 30. By varying the number and arrangement of pillars 32 on the stamp and transfer stamps 30, the distribution of components 10 on the pillars 32 of the transfer stamp 30 can be likewise varied, as can the distribution of the components 10 on the destination substrate 20.

In a further embodiment, referring to step 106 of FIG. 10, a destination substrate 20 is provided. An optional adhesive layer can be coated over the destination substrate 20. In step 130, the components 10 on the pillars 32 of the transfer stamp 30 are brought into alignment with the backplane contact pads 22 of the destination substrate 20 and pressed onto or into the backplane contact pads 22 in step 140 by micro-transfer printing with sufficient mechanical pressure against the backplane contact pads 22 to drive the connection posts 16 into or through a surface of the backplane contact pads 22 to form a robust electrical contact between the connection posts 16 of the component 10 and the backplane contact pads 22. A sufficient mechanical pressure can be an amount of force needed to cause the backplane contact pad 22 or connection post 16 to plastically deform as the connection post 16 is pressed into the backplane contact pad 22. Thus, in this embodiment, the connection posts 16 on the active components 10 may have sharp points and/or a high elastic modulus, for example, by incorporating tungsten. A connection post 16 can have a sharp point, for example, if the top of the post has an area less than 10 microns square, less than 5 microns square, or less than one-micron square. The backplane contact pads 22 can also provide adhesion to help adhere the components 10 to the destination substrate 20.

The adhesion between the components 10 and the receiving side of the destination substrate 20 should be greater than the adhesion between the components 10 and the pillars 32 of the transfer stamp 30. As such, when the transfer stamp 30 is removed from the receiving side of the destination substrate 20, the components 10 adhere more strongly to the destination substrate 20 than to the transfer stamp 30, thereby transferring the components 10 from the transfer stamp 30 to the receiving side of the destination substrate 20.

The transfer stamp 30 is then removed leaving the components 10 adhered to the destination substrate 20. An optional heat treatment in step 150 can solder or weld the connection posts 16 of the components 10 to the backplane contact pads 22 of the destination substrate 20. Thus, in a further method, the backplane contact pads 22 (or connection posts 16) are heated, causing the backplane contact pad metal to reflow and improve adhesion between the components 10 and the destination substrate 20 and improve the electrical connection to the connection posts 16.

Figure 11:
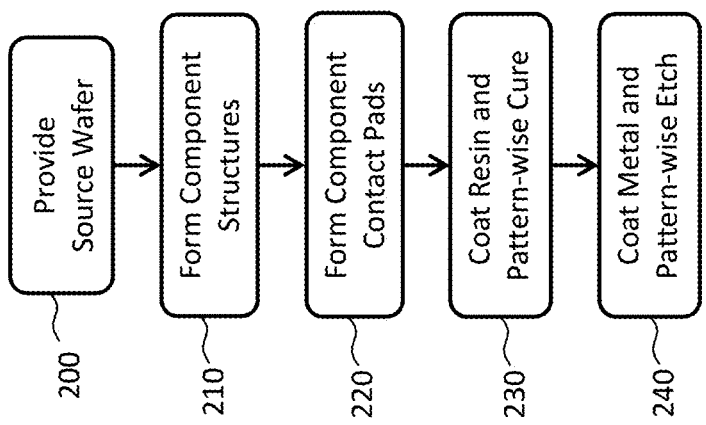
Figure 13:
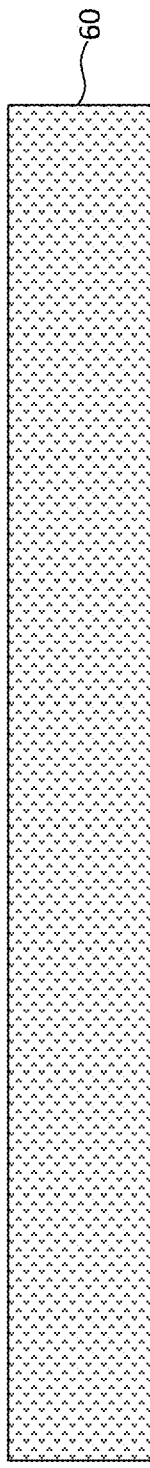
Figure 14:
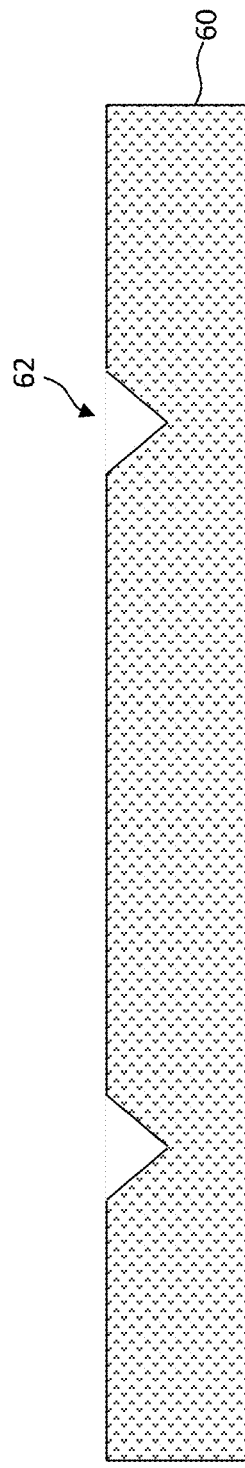

Thus, referring next to FIG. 11, illustrative methods include selectively transferring components 10 from a native source wafer to a non-native destination substrate 20 by providing a source substrate in step 200 having a process side 40 and a plurality of components 10 formed on or in the process side 40 of the source wafer in step 210. Component contact pads 12 are formed on the process side 40 of the component 10 in step 220. Repeated steps of coating resin or metal followed by pattern-wise curing or etching form connection posts 16 in step 230. If a conductive material 19 is desired to form a multi-layer connection post 16, a metal coating can be formed by evaporation or sputtering and patterned over the patterned layers of metal or resin in step 240.

A stamp having a plurality of pillars 32 formed thereon is spatially aligned to the components 10. Each pillar 32 of the stamp has a first area. The pillars 32 of the stamp are pressed against corresponding components 10 to adhere the components 10 to the pillars 32 of the stamp. A transfer stamp 30 having a plurality of pillars 32 is spatially aligned to the pillars 32 of the stamp. Each pillar 32 of the transfer stamp 30 has a second area greater than the first area. The pillars 32 of the transfer stamp 30 are pressed against corresponding components 10 on the pillars 32 of the stamp to adhere the components 10 to the pillars 32 of the transfer stamp 30. The components 10 are aligned with and then pressed against the destination substrate 20 to adhere the components 10 to the destination substrate 20.

Figure 12:
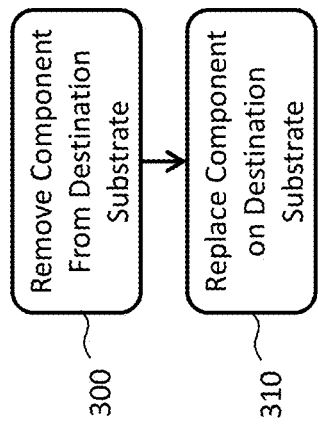

In an additional embodiment, referring to FIG. 12, a component 10 is removed from the destination substrate 20, for example if the component 10 is faulty, in step 300. In a further optional step 310, the faulty component 10 is replaced with a different component 10, for example using the same micro transfer printing methods described above.

In some embodiments, an electronically active substrate includes a destination substrate 20 having a plurality of backplane contact pads 22. The backplane contact pads 22 have a surface. A plurality of components 10 are distributed over the destination substrate 20. Each component 10 includes a component substrate, for example a semiconductor substrate, different from the destination substrate 20, for example a printed circuit board resin or epoxy substrate. Each component 10 has a circuit 14 and connection posts 16 formed on a process side 40 of the component substrate. The connection posts 16 have a base width and a height that is greater than the base width. The connection posts 16 are in electrical contact with the circuit 14 and the backplane contact pads 22. The connection posts 16 are in contact with, embedded in, or driven through the surface of the backplane contact pads 22 into the backplane contact pads 22 to electrically connect the connection posts 16 to the backplane contact pads 22.

In some embodiments, an adhesive layer 18 is formed over the destination substrate 20 between the active components 10 and the destination substrate 20 (see also FIG. 22 described below), so that the connection posts 16 pass through the adhesive layer 18 into the backplane contact pads 22. The adhesive layer 18 can be a curable adhesive layer and the adhesive layer can be cured to adhere the active components 10 to the destination substrate 20.

Figure 15:
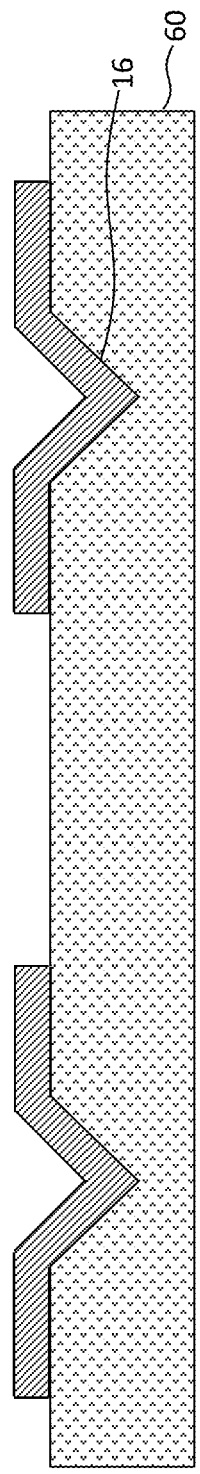

Referring next to FIGS. 13-20, in a method, a forming substrate 60 is provided (FIG. 13) and patterned to make forms 62, for example holes or other indentations on the forming substrate 60 (FIG. 14) made by pattern-wise etching the forming substrate 60. The forming substrate 60 can be, for example, a silicon 100 wafer and can be etched by a combination of dielectric hard masks, photolithography, mask etching, and anisotropic silicon we etching with, for example KOH or TMAH, or dry etching. A layer of conductive material is deposited, for example with evaporation, e-beam deposition, sputtering, or CVD, and patterned by etching through a patterned photo-resist mask, to form connection posts 16 at least in the forms 62 and optionally also on the planar surface of the forming substrate 60 (FIG. 15). Soft metals can be used, such as gold, silver, tin, solders, or hard materials such as Ti, W, Mo, Ta, Al, or Cu.

Figure 23:
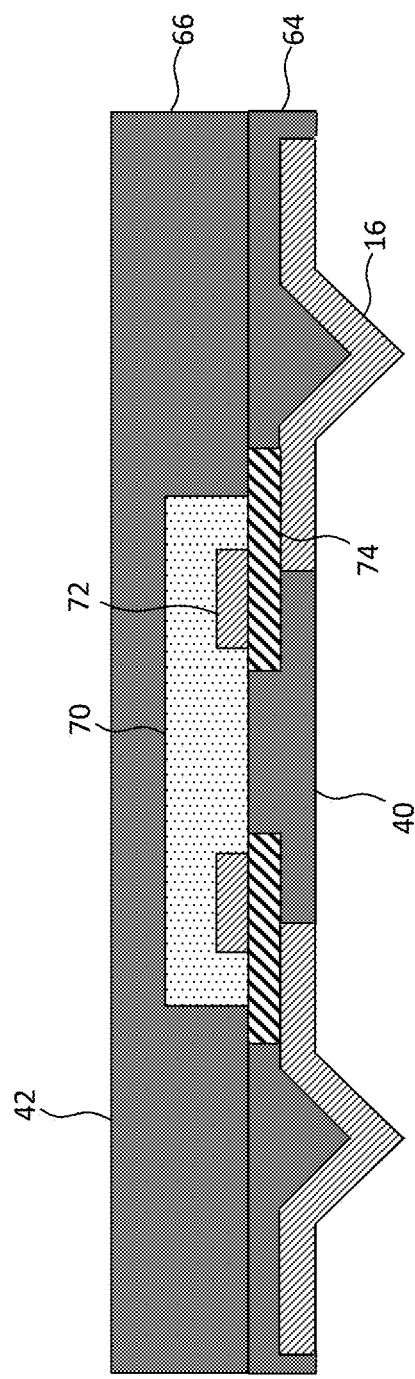
FIG. 23 is a cross section illustrating a printable component structure, according to illustrative embodiments of the disclosure.

A material layer, for example an insulating layer such as a first dielectric layer 64, for example an inorganic dielectric such as silicon dioxide or silicon nitride, or an organic insulator such as a polymer or a curable polymer, resin or epoxy is coated over the patterned layer of conductive material (including the connection posts 16) and the forming substrate 62 (FIG. 16). One or more chiplets 70 having chiplet contact pads 72 for electrical connections to circuitry in the chiplets 70 are disposed on the first dielectric layer 70 (FIG. 17). The chiplets 70 can be disposed with the chiplet contact pads 72 on a side of the chiplet 70 opposite the connection posts 16 (as shown in FIG. 17) or adjacent to the connection posts (FIG. 23). Next, as shown in FIG. 18, a conductor is formed that electrically connects the chiplet contact pads 72 to the connection posts 16. This can be accomplished, for example, by forming vias in the first dielectric layer and patterning a metal layer (for example evaporated or sputtered) on the first dielectric layer 64. Note that additional insulators (e.g., a patterned dielectric layer) can be provided on the chiplet 70 or the first dielectric layer 64 to avoid electrical shorts between the semiconductor layers of the chiplet 70 and the conductor 74. As shown in FIG. 18, the conductor 74 extends over the chiplet 70. Alternatively, as shown in FIG. 23, the conductor 74 is located beneath the chiplet 70. Useful materials include solder, tin, aluminum, gold, silver and other metals or metal alloys. In the embodiment shown in FIG. 23, additional heat treatments can be provided to electrically connect the chiplet contact pads 72 to the connection posts 16. The conductor 74 can be made to extend slightly above the surface of the first dielectric layer 64 to enhance contact between the chiplet contact pads 72 and the connection posts 16.

Figure 20:
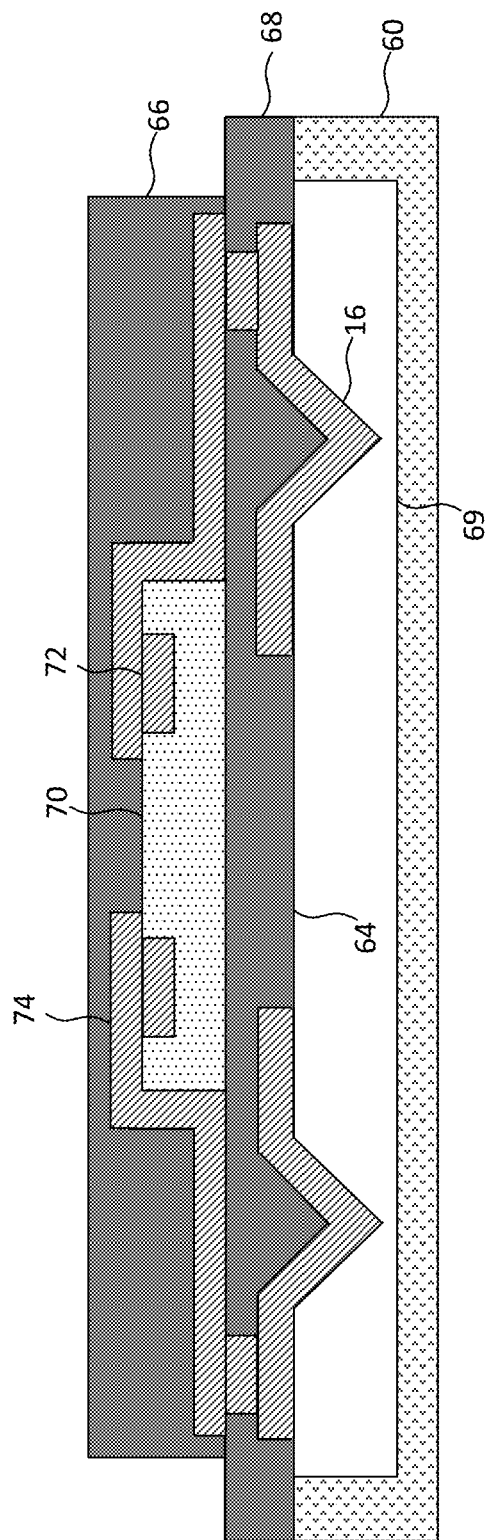

The printable component is then defined, for example by etching the first dielectric layer 64 (for example using an anisotropic etch, an aqueous base etchant, KOH, or TMAH) to form a release layer and anchors in the forming substrate 60 connected by tethers to the printable component. In one embodiment, second or third dielectric layers are provided to facilitate the definition of the printable component, the anchors, and the tethers. Referring to FIG. 19, a second dielectric layer 66 is coated and patterned to aid in defining the printable component and forming the anchors 68 and tethers. In particular, as shown in FIG. 20, a space 69 is formed (only seen in cross section) that enables the release of the printable component from the forming substrate 60.

Figure 21:
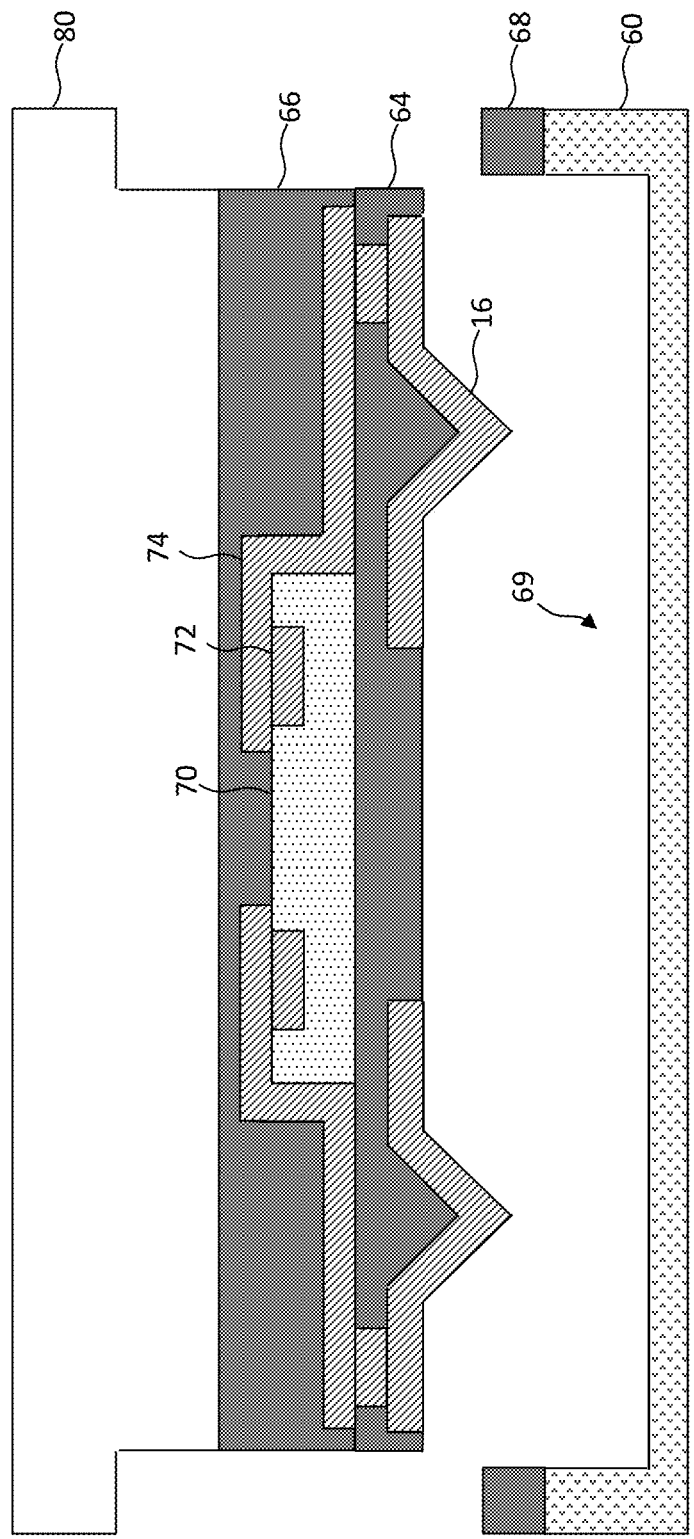
FIGS. 21-22 are cross sections illustrating steps of making a printed structure, according to illustrative embodiments of the disclosure.

In a further embodiment, a stamp 80 is used to release the printable component from the forming substrate 60 as part of a micro transfer print process, as shown in FIG. 21. The printable component is then micro transfer printed to a destination substrate 20 as described above (FIG. 22) so that each connection post 16 is in contact with, extends into, or extends through a backplane contact pad 22 of the destination substrate 20 to electrically connect the backplane contact pads 22 to the connection posts 16 and the chiplet contact pads 72. The backplane contact pads can include a soft metal, for example silver, tin, gold, or solder, or a harder metal. FIG. 22 illustrates the backplane contact pads 22 covered with a polymer layer, for example an adhesive layer or other polymer layer that facilities embedding the connection posts 16 in the backplane contact pads 22. Alternatively, as described above but not shown, a compliant material layer, for example a polymer, is located beneath the backplane contact pads 22.

FIG. 23 illustrates an alternative orientation of the chiplet 70 to the connection posts 16 corresponding to FIG. 19 (but without illustrating the forming substrate 60). The structure of FIG. 23 can be processed to define the printable component, tethers, and anchors 64 and printed as described above with respect to FIGS. 20-22. Thus, according to some embodiments, a printable component includes a first dielectric layer 64 having connection posts 16 protruding from the dielectric layer 64, a chiplet 70 having chiplet contact pads 72 disposed on the first dielectric layer 64, and conductors 74 electrically connecting the connection posts 16 to the chiplet contact pads 72. The chiplet contact pads 72 can be located on a side of the chiplet 70 adjacent to the connection posts 16 (FIG. 23) or on a side of the chiplet 70 opposite the connection posts 16 (FIG. 19). A patterned electrical connection layer can form the conductor 74 over the chiplet 70 and first dielectric layer 64 (FIG. 19) or between the connection posts 16 and the chiplet contact pads 72 (FIG. 23). In some embodiments, the connection posts 16 are multi-layer connection posts 16.

In a further embodiment, the component is a light-emitting component that emits light. In one arrangement, the light is emitted in a direction opposite to the connection posts 16. In a further embodiment, the chiplet 70 is covered with a second dielectric layer (e.g., second dielectric layer 66). The second dielectric layer 66 can be transparent to visible light or to the frequencies of light emitted by the light emitter and the light can be emitted through the second dielectric layer 66.

Figure 24:
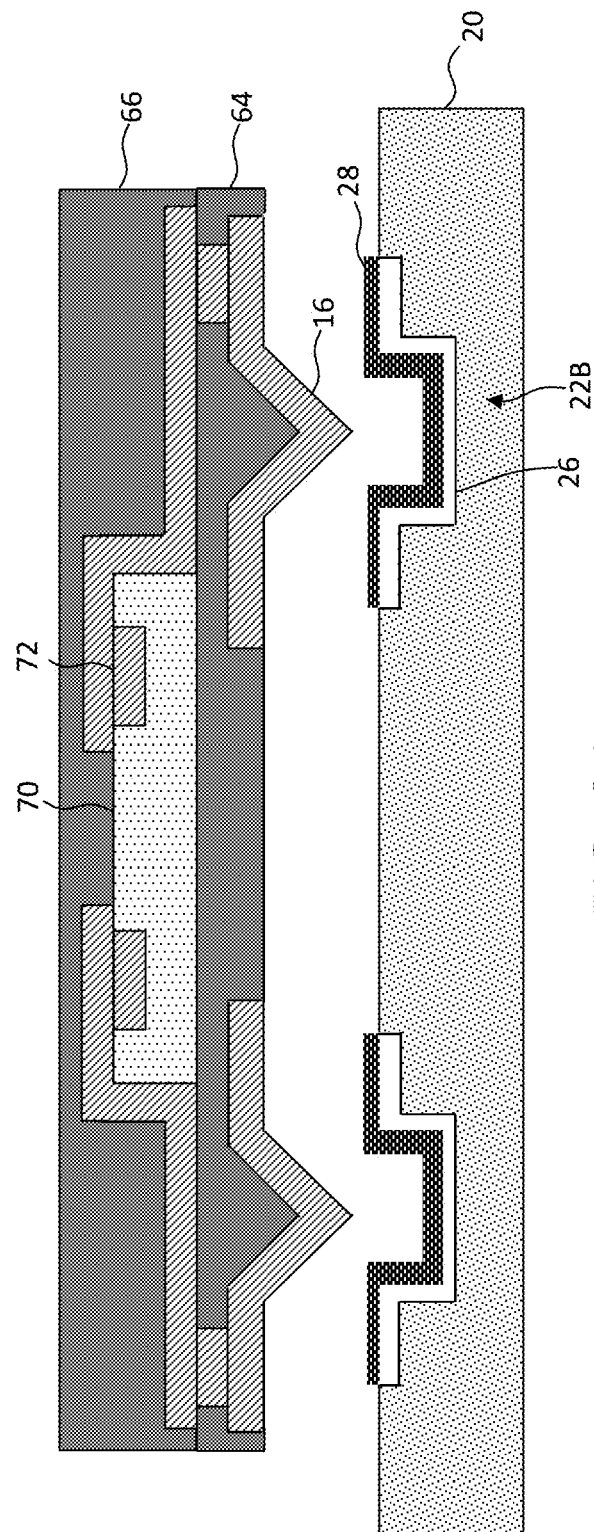
FIG. 24 is a cross section illustrating a printed structure, according to illustrative embodiments of the disclosure.

Referring next to FIG. 24, in some embodiments, a destination substrate 20 for receiving transfer-printed printable components includes a substrate having a surface on or in which a plurality of non-planar contact pads 22B are formed and exposed on the surface so that electrical connections can be made to the non-planar contact pads 22B. The non-planar contact pads 22B can be a multi-layer contact pads having one layer 28 on another layer 26 as described. In this embodiment, the backplane contact pad 22 can have a first conductive layer and a second conductive layer over the first conductive layer, and the second conductive layer has a lower melting temperature than the first conductive layer. The second conductive layer can be a solder. Alternatively, the backplane contact pad 22 is coated with a non-conductive layer or the backplane contact pad 22 is formed on a compliant non-conductive layer, to facilitate electrical connection and adhesion. The non-conductive layer can be a polymer or an adhesive or the compliant non-conductive layer can be a polymer.

Figure 25:
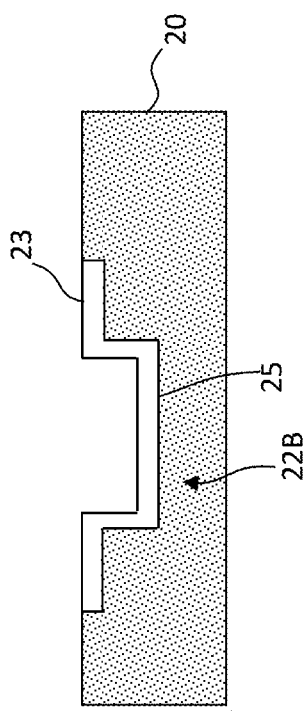
FIGS. 25 and 26 are cross sections illustrating contact pads on a destination substrate, according to illustrative embodiments of the disclosure.
Figure 26:
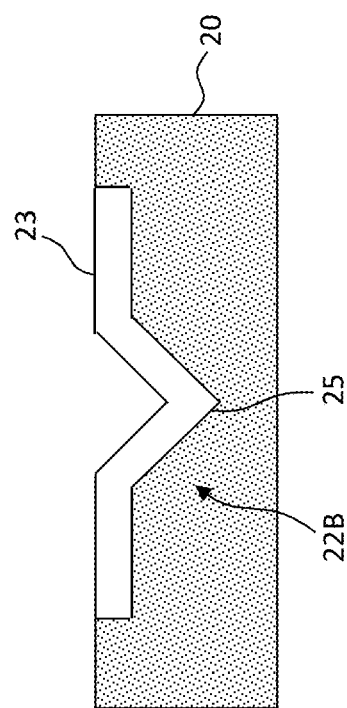

Referring also to FIGS. 25 and 26, the non-planar contact pads 22B have a perimeter portion 23 surrounding a central portion 24. The perimeter portion 23 is closer to the surface than the central portion 25, so that the non-planar contact pads are shaped to accept the connection posts 16 of the printable components and improve the electrical connection between the connection posts 16 and the non-planar contact pads 22B, for example by increasing the surface area of connection posts 16 and the non-planar contact pads 22B that are in contact.

Figure 27:
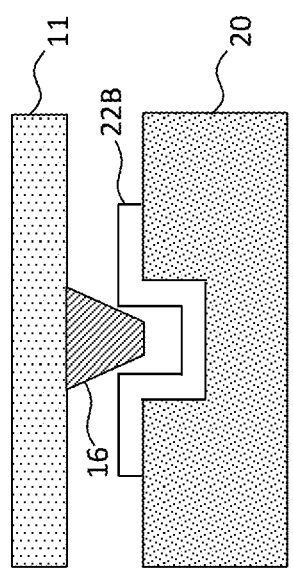
FIGS. 27 and 28 are cross sections illustrating contact pads and a connection post, according to illustrative embodiments of the disclosure.
Figure 28:
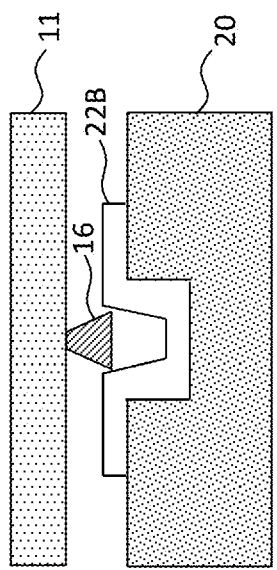

As shown in FIGS. 27 and 28, in some embodiments, a variety of connection posts 60 having different shapes are inserted into the non-planar backplane contact pads 22B.

Figure 29:
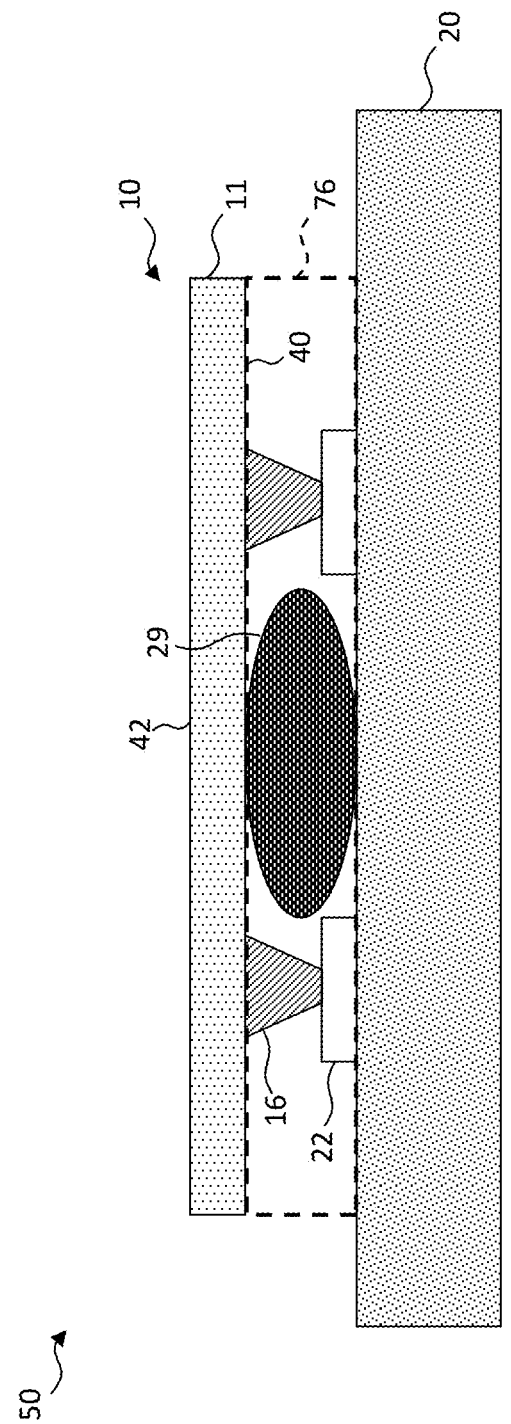
FIG. 29 is a cross section illustrating an underfilled volume between the destination substrate and the printable component, according to illustrative embodiments of the disclosure.

As shown in FIG. 29, a shrinkable material 29 is disposed in and underfills the volume between the printable component and the destination substrate 20. The shrinkable material can be an adhesive and can adhere the printable component and the destination substrate 20. By underfill is meant that the shrinkable material 29 does not fill the volume between the printable component and the destination substrate 20. Furthermore, with a heat treatment provided after disposing the shrinkable material, the shrinkable material 29 shrinks and provides compression between the printable component and the destination substrate 20 to further strengthen and make robust the electrical connection between the connection posts and the backplane contact pads 22.

According to some embodiments, referring to FIGS. 1, 5, 6, and 29, a method of making a printed structure 50 comprises providing a destination substrate 20, contact pads (e.g., backplane contact pads 22) disposed on the destination substrate 20, and a layer of adhesive (e.g., shrinkable material) 29 disposed on the destination substrate 20. A stamp (e.g., a transfer stamp) 30 with a component 10 adhered to the stamp 30 is provided. The component 10 comprises a stamp side 42 in contact with the stamp 30 and a post side 40 opposite the stamp side 42, a circuit 14 (e.g., which is included in a chiplet 70 that is or is part of component 10), and connection posts 16 extending from the post side 40. Each connection post 16 is electrically connected to the circuit 14. The component 10 is pressed into contact with the adhesive layer 29 to adhere the component 10 to the destination substrate 20 and form a printed structure 50 having a volume 76 defined (e.g., as shown in FIG. 29) between the component 10 and the destination substrate 20. The stamp 30 is removed, and the printed structure 50 is processed to fill or reduce the volume 76.

The adhesive layer 29 can be disposed as a patterned or an unpatterned adhesive layer 29. The adhesive layer 29 can be patterned without crosslinking, thereby facilitating adhesion between the adhesive layer 29 and the component 10. The adhesive layer 29 can be patterned and provided uncrosslinked, thereby facilitating adhesion between the adhesive layer 29 and the component 10. The adhesive 29 can be crosslinked after the component 10 is pressed into the adhesive layer 29 (e.g., during processing). The adhesive layer 29 can be disposed as a pattern that leaves at least a portion of the contact pads 22 uncovered or disposed as a pattern such that no adhesive 29 is between the connection posts 16 and contact pads 22, or both. The step of processing the printed structure 50 can comprise changing the pattern of the adhesive 29 from a first shape with an area parallel to the destination substrate 20 and a height perpendicular to the destination substrate 20 to a second shape having a smaller height and a larger area.

In some embodiments, pressing connection posts 16 into an adhesive layer 29 contacts each of the connection posts 16 to a contact pad 22 (e.g., of a plurality of contact pads 22). In some embodiments, the step of pressing the connection posts 16 into the adhesive layer 29 does not contact each connection post 16 to a contact pad 22. In some embodiments, the adhesive layer 29 is disposed such that at least a portion of the contact pads 22 is uncovered. In some embodiments, the adhesive layer 29 is disposed such that no adhesive 29 is between the connection posts 16 and the contact pads 22.

The adhesive layer 29 can be provided with a thickness over the destination substrate 20 that is less than a distance between the post side 40 and the destination substrate 20 after the step of pressing the connection posts 16 into the adhesive layer 29 or that is greater than or equal to a distance between the post side 40 and the destination substrate 20 after the step of pressing the connection posts 16 into the adhesive layer 29. In some embodiments, the adhesive layer 29 is provided with a thickness over the destination substrate 20 that is less a height of one or more connection posts 16. In some embodiments, the adhesive layer 29 is provided with a thickness that is greater than a height of one or more connection posts 16.

In some embodiments, adhesive 29 is cured (e.g., during processing). The adhesive 29 can be cured in a pattern defined by the components 10 over the destination substrate 20. The adhesive 29 can be a positive resist. In some embodiments, a method comprises removing adhesive 29 from the area over the destination substrate 20 that is not between the component 10 and the destination substrate 20. The adhesive 29 can be or comprise, for example, one or more of polybenzoxazole (PBO), an epoxy, a polyimide, a photoresist, and an acrylic.

According to some embodiments, the amount of volumetric contraction is greater than the thermal expansion of the adhesive 29 over the working temperature of the adhesive 29 or printed structure 50. For example, an amount of volumetric contraction of an adhesive 29 is greater than an amount of thermal expansion of the adhesive 29 at an upper working (e.g., service) temperature of the adhesive 29. A volume 76 can be partially unfilled either before or after processing. A volume 76 can be filled with adhesive 29 and processing a printed structure 50 can comprise reducing the volume 76 of the adhesive 29 between a component 10 and a destination substrate 20. Processing a printed structure 50 can comprise infiltrating the adhesive from around a component 10 into a respective volume 76. Processing a printed structure 50 can comprise moving a component 10 toward a destination substrate 20. Processing a printed structure 50 can comprise wicking adhesive 29 over or on one or more surfaces of one or more of a component 10, contact pads 22, and a destination substrate 20 into a volume 76. Processing a printed structure 50 can comprise changing the viscosity or temperature of an adhesive 29, or both the viscosity and temperature of the adhesive 29. Adhesive 29 can comprise a solvent and processing a printed structure 50 can comprise changing a concentration of the solvent in the adhesive 29. According to some embodiments, processing a printed structure 50 comprises elevating the temperature of the printed structure 50 to increase the density of the adhesive 29, thereby reducing the volume 76.

Adhesive 29 can comprise one or more compounds and processing a printed structure 50 can comprise elevating the temperature of the printed structure 50 to volatilize the one or more compounds, thereby reducing a volume 76 between a component 10 and a destination substrate 20. Processing a printed structure 50 can comprise gradient heating the printed structure 50.

According to some embodiments, each connection post 16 is electrically conductive and comprises a sharp point (for example as shown in FIG. 23). Each connection post 16 can be electrically conductive and can comprise a height H that is greater than its base width W, and a base area that is greater than its peak area (for example as shown in FIG. 1). Each connection post 16 can comprise a conductive metal.

A component 10 can be or comprise an active component 10. The component 10 can be or comprise an integrated circuit, a transistor, or an LED. The component 10 can have at least one dimension between 1 micron and 200 microns.

Methods according to certain embodiments can comprise providing more than two contact pads 22, a plurality of components 10, or both. A plurality of components 10 can be transferred using a single stamp 30 (e.g., comprising a plurality of posts). According to some embodiments, the component 10 comprises more than two connection posts 16 extending from the post side 40, each connection post 16 electrically connected to the circuit 14.

According to some embodiments, an electrical interconnection structure (e.g., a printed structure 50) comprises a destination substrate 20, contact pads 22 disposed on the destination substrate 20, and a patterned layer of adhesive 29 disposed on the destination substrate 20. A component 10 comprises a post side 40 and connection posts 16 extending from the post side 40, each connection post 16 electrically connected to one of the contact pads 22, and at least a portion of the post side 40 in contact with the patterned layer of adhesive 29. The patterned layer of adhesive 29 can occupy a portion of a volume 76 between the component 10 and the destination substrate 20 and the patterned layer of adhesive 29 can press the connection posts 16 to the contact pads 22. According to some embodiments, the patterned layer of adhesive 29 does not contact the connection posts 16.

Figure 31:
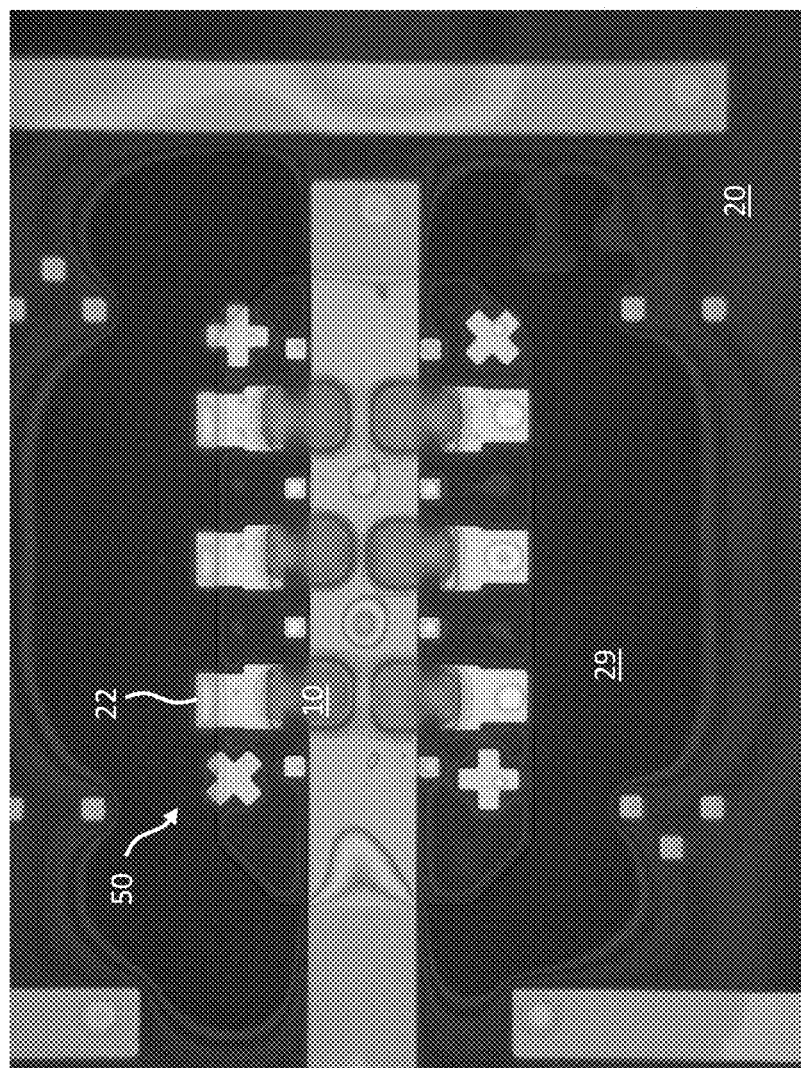
FIG. 31 is a micrograph of a printed structure according to illustrative embodiments of the disclosure.

A printed structure 50 according to some embodiments has been constructed by micro-transfer printing LEDs (components 10) to a destination substrate 20 and is shown in FIG. 31. The FIG. 31 top view micrograph obscures the connection posts 16 electrically connected to the destination substrate contact pads 22. Adhesive 29 that was initially disposed in a layer thinner than the gap formed by volume 76 is processed to fill volume 76 (also not visible in FIG. 31) with the adhesive 29 and cure the adhesive 29 (shown on destination substrate 20 around the components 10 in FIG. 31).

According to one embodiment, the source wafer can be provided with components 10 and component contact pads 12 and connection posts 16 already formed on the process side 40 of the source wafer. Alternatively, an unprocessed source wafer can be provided and the components 10 formed on the process side 40 of the source wafer. An unprocessed source wafer is a substrate that does not yet include components 10. The unprocessed source wafer can have other processing steps completed, for example, cleaning, deposition of material layers, or heat or chemical treatments, as are used in the photo-lithographic arts. Components 10 are formed, for example using photo-lithographic processes including forming masks over the source wafer, etching materials, removing masks, and depositing materials. Such processes are used in the photo-lithographic arts. Using such processes, components 10 are formed on or in the process side 40 of the source wafer.

Components 10 can be small electronic integrated circuits, for example, having a size of about 5 microns to about 5000 microns in at least one dimension. The electronic circuits can include semiconductor materials (for example inorganic materials such as silicon or gallium arsenide, or inorganic materials) having various structures, including crystalline, microcrystalline, polycrystalline, or amorphous structures. In some embodiments, the components 10 are passive, for example including a conductor that, when used in a printed structure 50 serves to electrically connect one conductor (e.g., a backplane contact pad 22) to another, forming a jumper. The components 10 can also include insulating layers and structures such as silicon dioxide, nitride, and passivation layers and conductive layers or structures including wires 13 made of aluminum, titanium, silver, or gold that foam an electronic circuit. Connection posts 16 or component contact pads 12 can be formed of metals such as aluminum or polysilicon semiconductors and can be located on the process side 40 of the components 10. Methods and materials for making component 10 electronic circuits are used in the integrated circuit arts. Large numbers of such small integrated circuits are formed on a single source wafer. The components 10 are typically packed as closely as possible to use the surface area of the source wafer as efficiently as possible.

In some embodiments, the components 10 are small integrated circuits formed in a semiconductor wafer, for example gallium arsenide or silicon, which can have a crystalline structure. Processing technologies for these materials typically employ high heat and reactive chemicals. However, by employing transfer technologies that do not stress the component 10 or substrate materials, more benign environmental conditions can be used compared to thin-film manufacturing processes. Thus, structures and methods according to certain embodiments of the present disclosure have an advantage in that flexible substrates, such as polymeric substrates, that are intolerant of extreme processing conditions (e.g. heat, chemical, or mechanical processes) can be employed for the destination substrates 20. Furthermore, it has been demonstrated that crystalline silicon substrates have strong mechanical properties and, in small sizes, can be relatively flexible and tolerant of mechanical stress. This is particularly true for substrates having 5-micron, 10-micron, 20-micron, 50-micron, or even 100-micron thicknesses. Alternatively, the components 10 can be formed in a microcrystalline, polycrystalline, or amorphous semiconductor layer.

The components 10 can be constructed using foundry fabrication processes used in the art. Layers of materials can be used, including materials such as metals, oxides, nitrides and other materials used in the integrated-circuit art. Each component 10 can be a complete semiconductor integrated circuit and can include, for example, transistors. The components 10 can have different sizes, for example, 1000 square microns or 10,000 square microns, 100,000 square microns, or 1 square mm, or larger, and can have variable aspect ratios, for example 1:1, 2:1, 5:1, or 10:1. The components 10 can be rectangular or can have other shapes.

Certain embodiments provide advantages over other printing methods described in the prior art. By employing connection posts 16 on components 10 and a printing method that provides components 10 on a destination substrate 20 with the process side 40 and connection posts 16 adjacent to the destination substrate 20, a low-cost method for printing chiplets in large quantities over a destination substrate 20 is provided. Furthermore, additional process steps for electrically connecting the components 10 to the destination substrate 20 are obviated.

The source wafer and components 10, stamp, transfer stamp 30, and destination substrate 20 can be made separately and at different times or in different temporal orders or locations and provided in various process states.

Transferring components 10 can be iteratively applied to a single or multiple destination substrates 20. By repeatedly transferring sub-arrays of components 10 from a transfer stamp 30 to a destination substrate 20 and relatively moving the transfer stamp 30 and destination substrates 20 between stamping operations by a distance equal to the spacing of the selected components 10 in the transferred sub-array between each transfer of components 10, an array of components 10 formed at a high density on a source wafer can be transferred to a destination substrate 20 at a much lower density. In practice, the source wafer is likely to be expensive, and forming components 10 with a high density on the source wafer will reduce the cost of the components 10, especially as compared to forming components on the destination substrate 20. Transferring the components 10 to a lower-density destination substrate 20 can be used, for example, if the components 10 manage elements distributed over the destination substrate 20, for example in a display, digital radiographic plate, or photovoltaic system.

In particular, in the case wherein the active component 10 is an integrated circuit formed in a crystalline semiconductor material, the integrated circuit substrate provides sufficient cohesion, strength, and flexibility that it can adhere to the destination substrate 20 without breaking as the transfer stamp 30 is removed.

In comparison to thin-film manufacturing methods, using densely populated source substrates wafers and transferring components 10 to a destination substrate 20 that requires only a sparse array of components 10 located thereon does not waste or require active layer material on a destination substrate 20. Transferring components 10 made with crystalline semiconductor materials that have higher performance than thin-film active components can also be performed in certain methods. Furthermore, the flatness, smoothness, chemical stability, and heat stability requirements for a destination substrate 20 used in some embodiments may be reduced because the adhesion and transfer process is not substantially limited by the material properties of the destination substrate 20. Manufacturing and material costs may be reduced because of high utilization rates of more expensive materials (e.g., the source substrate) and reduced material and processing requirements for the destination substrate 20.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations a first layer on a second layer includes a first layer and a second layer with another layer therebetween.

It should be understood that the order of steps or order for performing certain action is immaterial so long as the disclosed technology remains operable. Moreover, two or more steps or actions in some circumstances can be conducted simultaneously.

In this application, unless otherwise clear from context or otherwise explicitly stated, (i) the term "a" may be understood to mean "at least one"; (ii) the term "or" may be understood to mean "and/or"; (iii) the terms "comprising" and "including" may be understood to encompass itemized components or steps whether presented by themselves or together with one or more additional components or steps; (iv) the terms "about" and "approximately" may be understood to permit standard variation as would be understood by those of ordinary skill in the relevant art; and (v) where ranges are provided, endpoints are included.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

Having described certain embodiments, it will now become apparent to one of skill in the art that other implementations incorporating the concepts of the disclosure may be used. Therefore, the disclosure should not be limited to certain implementations, but rather should be limited only by the spirit and scope of the following claims.

PARTS LIST

D1 distance
D2 distance
H height
W base width
W2 peak width
10, 10A, 10B, 10C, 10D component
11 semiconductor layer
12 component contact pad
13 wire
14 circuit
15 electrical connection
16 connection post
16A short connection post
16B deformed/crumpled connection post
17 group of connection posts
18 post material
19 conductive material/solder
20 destination substrate
22 contact pad/backplane contact pad/destination substrate contact pad
22A deformed/crumpled backplane contact pad
22B non-planar contact pad
23 perimeter portion
24 conductive material/solder
25 perimeter portion
26 layer
28 layer
29 shrinkable material/adhesive/adhesive layer
30 stamp/transfer stamp
32 pillars
40 process side/post side
42 back side/stamp side
50 printed structure/electrical interconnection structure
60 forming substrate
62 form
64 first dielectric layer
66 second dielectric layer
68 anchor
69 space
70 chiplet
72 chiplet contact pad
74 conductor
76 volume
80 stamp
100 provide source wafer step
102 provide stamp step
104 provide transfer stamp step
106 provide destination substrate step
110 contact components with stamp step
120 contact components with transfer stamp step
130 align components to destination substrate step
140 micro transfer print components to destination substrate step
150 optional heat structure step
200 provide source wafer step
210 form component structure in wafer step
220 form component contact pads on component structure step
230 coat resin and pattern-wise cure step
240 coat metal and pattern-wise etch step
300 remove component from destination substrate step
310 replace component on destination substrate step

The invention claimed is:

1. A method of making a printed structure, comprising:
providing a destination substrate, contact pads disposed on or in the destination substrate, and a layer of adhesive disposed on the destination substrate;
providing a stamp with a component adhered to the stamp, the component having a stamp side in contact with the stamp and a post side opposite the stamp side, wherein the component comprises a circuit and connection posts extending from the post side, each of the connection posts electrically connected to the circuit;
pressing the component into contact with the adhesive layer to adhere the component to the destination substrate to form the printed structure having a volume defined between the component and the destination substrate;
removing the stamp; and
processing the printed structure to fill or reduce the volume, wherein the step of processing the printed structure comprises moving the component toward the destination substrate.

2. The method of claim 1, wherein the adhesive layer is disposed as an unpatterned adhesive layer.

3. The method of claim 1, wherein the step of pressing the into contact with the adhesive layer contacts each of the connection posts to one of the contact pads.

4. The method of claim 1, wherein the step of pressing the component into contact with the adhesive layer does not contact each of the connection posts to one of the contact pads.

5. The method of claim 1, wherein the adhesive layer is provided with a thickness over the destination substrate that is less than a distance between the post side and the destination substrate after the step of pressing the component into contact with the adhesive layer.

6. The method of claim 1, wherein the adhesive layer is provided with a thickness over the destination substrate that is greater than or equal to a distance between the post side and the destination substrate after the step of pressing the component into contact with the adhesive layer.

7. The method of claim 1, comprising curing the adhesive.

8. The method of claim 1, comprising curing the adhesive in a pattern defined by spacing of components over the destination substrate.

9. The method of claim 1, wherein the adhesive is a positive resist and the method comprises removing the adhesive from area over the destination substrate that is not between the component and the destination substrate.

10. The method of claim 1, wherein the adhesive is one or more of: polybenzoxazole (PBO), an epoxy, a polyimide, a photoresist, and an acrylic.

11. The method of claim 1, wherein an amount of volumetric contraction is greater than an amount of thermal expansion of the adhesive at an upper working temperature of the adhesive.

12. The method of claim 1, wherein the volume is partially unfilled.

13. The method of claim 1, wherein the volume is filled with the adhesive prior to the processing and the step of processing the printed structure comprises reducing a volume of the adhesive.

14. The method of claim 1, wherein the step of processing the printed structure comprises infiltrating the adhesive from around the component into the volume.

15. The method of claim 1, wherein the step of processing the printed structure comprises wicking the adhesive over or on one or more surfaces of one or more of the component, the contact pads, and the destination substrate into the volume.

16. The method of claim 1, wherein the step of processing the printed structure comprises at least temporarily changing a viscosity, a temperature, or both a viscosity and a temperature of the adhesive.

17. The method of claim 1, wherein the adhesive comprises a solvent when provided and the step of processing the printed structure comprises changing a concentration of the solvent in the adhesive.

18. The method of claim 1, wherein processing the printed structure comprises elevating a temperature of the printed structure to increase a density of the adhesive, thereby reducing the volume.

19. The method of claim 1, wherein the adhesive layer comprises one or more compounds and processing the printed structure comprises elevating a temperature of the printed structure to volatilize the one or more compounds, thereby reducing the volume.

20. The method of claim 1, wherein the step of processing the printed structure comprises gradient heating the printed structure.

* * * * *